United States Patent
Chuang et al.

(10) Patent No.: US 12,464,955 B2
(45) Date of Patent: Nov. 4, 2025

(54) MAGNETIC TUNNEL JUNCTION DEVICE AND METHOD OF FORMING THE SAME

(71) Applicant: Taiwan Semiconductor Manufacturing Co., Ltd., Hsinchu (TW)

(72) Inventors: Harry-HakLay Chuang, Zhubei (TW); Hung Cho Wang, Taipei (TW); Sheng-Huang Huang, Hsinchu (TW); Hung-Yu Chang, Taoyuan (TW); Keng-Ming Kuo, Yunlin County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 647 days.

(21) Appl. No.: 17/725,146

(22) Filed: Apr. 20, 2022

(65) Prior Publication Data

US 2023/0189657 A1   Jun. 15, 2023

Related U.S. Application Data

(60) Provisional application No. 63/287,734, filed on Dec. 9, 2021.

(51) Int. Cl.
*H10N 50/10* (2023.01)
*H10B 61/00* (2023.01)
*H10N 50/01* (2023.01)
*H10N 50/80* (2023.01)

(52) U.S. Cl.
CPC ............ *H10N 50/10* (2023.02); *H10B 61/00* (2023.02); *H10N 50/01* (2023.02); *H10N 50/80* (2023.02)

(58) Field of Classification Search
None
See application file for complete search history.

(56) References Cited

U.S. PATENT DOCUMENTS

| | | |
|---|---|---|
| 8,125,040 B2 | 2/2012 | Kang et al. |
| 9,263,667 B1 | 2/2016 | Pinarbasi |
| 9,343,129 B2 | 5/2016 | Shimomura |
| 9,406,875 B2 | 8/2016 | Li et al. |

(Continued)

FOREIGN PATENT DOCUMENTS

| | | |
|---|---|---|
| JP | 2010080649 A | 4/2010 |
| JP | 2011518440 A | 6/2011 |

(Continued)

*Primary Examiner* — Xiaoming Liu
(74) *Attorney, Agent, or Firm* — Slater Matsil, LLP

(57) ABSTRACT

Improved methods of patterning magnetic tunnel junctions (MTJs) for magnetoresistive random-access memory (MRAM) and semiconductor devices formed by the same are disclosed. In an embodiment, a method includes depositing a bottom electrode layer over a semiconductor substrate; depositing an MTJ film stack over the bottom electrode layer; depositing a top electrode layer over the MTJ film stack; patterning the top electrode layer; performing a first etch process to pattern the MTJ film stack; performing a first trim process on the MTJ film stack; after performing the first trim process, depositing a first spacer layer over the MTJ film stack; and after depositing the first spacer layer, performing a second etch process to pattern the first spacer layer, the MTJ film stack, and the bottom electrode layer to form an MRAM cell.

20 Claims, 20 Drawing Sheets

(56) References Cited

U.S. PATENT DOCUMENTS

| | | | |
|---|---|---|---|
| 9,564,582 | B2 | 2/2017 | Pakala et al. |
| 10,497,858 | B1 | 12/2019 | Ahn et al. |
| 10,516,102 | B1* | 12/2019 | Yang ................... H10N 50/10 |
| 11,276,816 | B2 | 3/2022 | Zhao et al. |
| 2004/0229430 | A1 | 11/2004 | Findeis et al. |
| 2005/0280040 | A1* | 12/2005 | Kasko ................... H10B 61/22 |
| | | | 257/256 |
| 2014/0210021 | A1 | 7/2014 | Zhu et al. |
| 2015/0061052 | A1* | 3/2015 | Huang ................. H10N 50/80 |
| | | | 257/421 |
| 2019/0148623 | A1 | 5/2019 | Liao et al. |
| 2020/0136027 | A1* | 4/2020 | Wu ....................... H10N 50/85 |
| 2020/0328343 | A1 | 10/2020 | Liao et al. |
| 2021/0043832 | A1 | 2/2021 | Huang et al. |
| 2021/0143324 | A1 | 5/2021 | Lin et al. |
| 2021/0273156 | A1* | 9/2021 | Chen .................... H10N 50/10 |
| 2021/0288242 | A1 | 9/2021 | Yogendra et al. |
| 2021/0343930 | A1 | 11/2021 | Hsu et al. |
| 2022/0376174 | A1 | 11/2022 | Yang et al. |

FOREIGN PATENT DOCUMENTS

| | | |
|---|---|---|
| JP | 2013201220 A | 10/2013 |
| JP | 2016505220 A | 2/2016 |
| JP | 2016541123 A | 12/2016 |
| JP | 20170527097 A | 9/2017 |
| TW | 201537743 A | 10/2015 |
| WO | 2019150885 A1 | 8/2019 |
| WO | 2020131206 A1 | 6/2020 |
| WO | 2021021486 A1 | 2/2021 |

\* cited by examiner

MAGNETIC TUNNEL JUNCTION DEVICE AND METHOD OF FORMING THE SAME

PRIORITY CLAIM AND CROSS-REFERENCE

This application claims the benefit of U.S. Provisional Application No. 63/287,734, filed on Dec. 9, 2021, which application is hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is magnetoresistive random-access memory (MRAM). A plurality of MRAM cells, each storing a bit of data, may be arranged in an MRAM array. Each of the MRAM cells may include a magnetic tunnel junction (MTJ) stack, which includes two ferromagnetic plates separated by a thin insulator. The magnetic polarity of a first of the ferromagnetic plates is fixed, while the polarity of the second of the ferromagnetic plates is free. A logic "0" or "1" may be stored in the MTJ by varying the polarity of the second ferromagnetic plate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
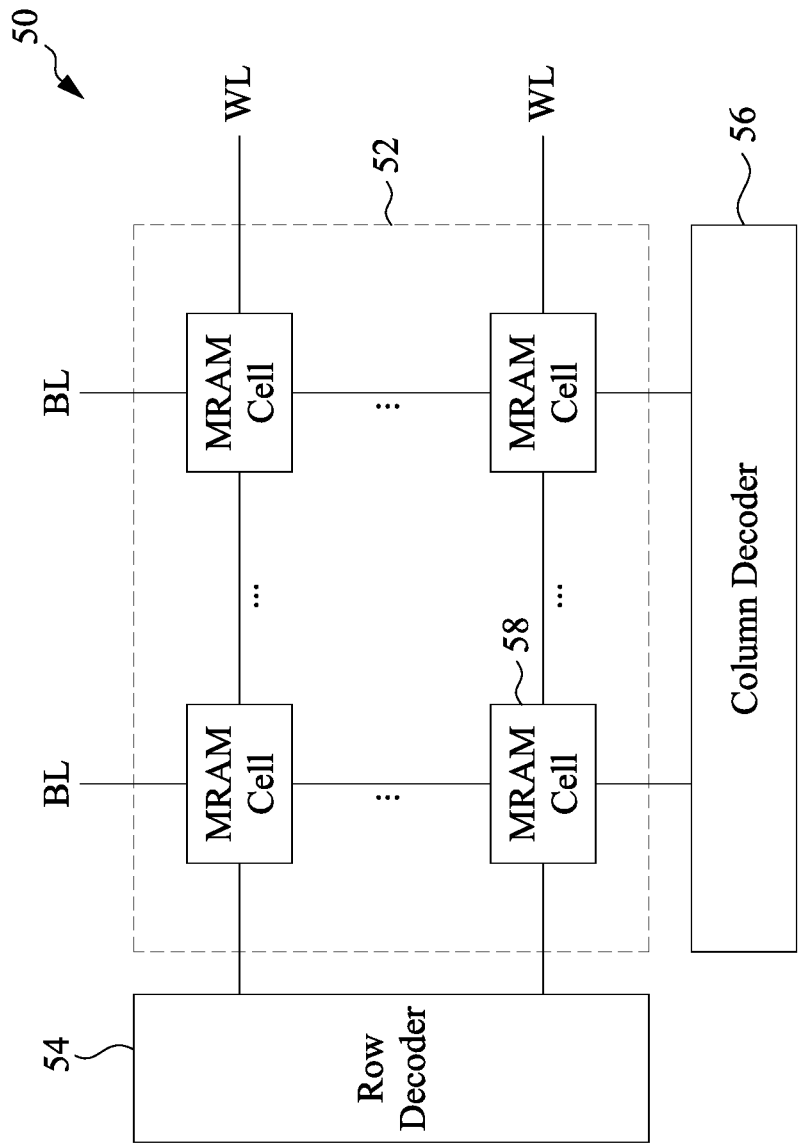
FIG. 1 is a block diagram of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved methods for forming magnetoresistive random-access memory (MRAM) devices and MRAM devices formed by the same. The method includes forming a bottom electrode, forming a magnetic tunnel junction (MTJ) over the bottom electrode, and forming a top electrode over the MTJ. The MTJ includes a reference layer (also referred to as a fixed layer or a pinned layer), a tunnel barrier layer over the reference layer, and a free layer over the reference layer. In some embodiments, the order of the reference layer and the free layer may be reversed. The top electrode is patterned and the underlying MTJ is patterned using the top electrode as a mask. The MTJ is patterned by ion beam etching (IBE) processes, which include a combination of high-angle IBE (e.g., incidence angle greater than 30°) and low-angle IBE (e.g., incidence angle less than 30°). The MTJ is patterned until the tunnel barrier layer is etched through and the reference layer is exposed. A spacer layer, such as silicon nitride or silicon oxide, is formed over the top electrode and the MTJ, and the spacer layer and the reference layer are etched through using IBE. High-angle IBE causes damage to sidewalls of the MTJ, which adversely affects magnetic properties (e.g., switching characteristics) of the resulting MRAM, while low-angle IBE deposits metal-like byproducts on sidewalls of the MTJ, which may cause shorts in the resulting MRAM. Forming the spacer layer after etching the free layer and the tunnel barrier layer protects sidewalls of the free layer and the tunnel barrier layer from damage caused by IBE, which reduces shorts and improves magnetic properties of the resulting MRAM. This reduces device defects and improves device performance.

FIG. 1 is a block diagram of a semiconductor device 50, in accordance with some embodiments. The semiconductor device 50 includes a magnetoresistive random-access memory (MRAM) array 52, a row decoder 54, and a column decoder 56. The MRAM array 52 includes MRAM cells 58 arranged in rows and columns. The row decoder 54 may be a static complementary metal-oxide-semiconductor (CMOS) decoder, a pseudo-NMOS decoder, or the like. During operation, the row decoder 54 selects desired MRAM cells 58 in a row of the MRAM array 52 by activating the respective word line WL for the row. The column decoder 56 may be a static CMOS decoder, a pseudo-NMOS decoder, or the like, and may include writer drivers, sense amplifiers, combinations thereof, or the like. During operation, the column decoder 56 selects desired MRAM cells 58 in a column of the MRAM array 52 and reads data from or writes data to the selected MRAM cells 58 with the bit lines BL.

Figure 2:
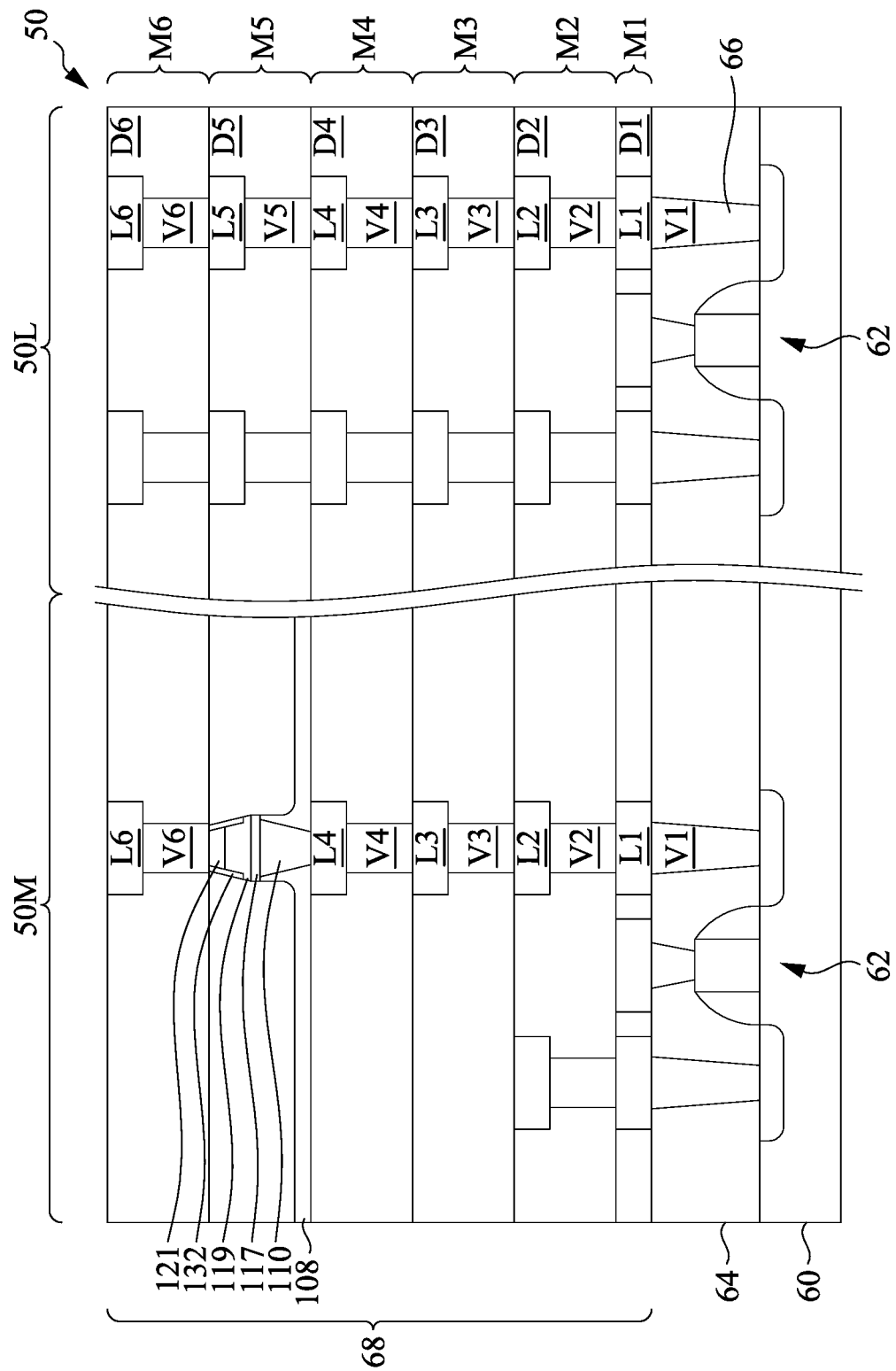
FIG. 2 is a cross-sectional view of the semiconductor device, in accordance with some embodiments.

FIG. 2 is a cross-sectional view of the semiconductor device 50, in accordance with some embodiments. FIG. 2 is a simplified view, and some features of the semiconductor device 50 (discussed below) are omitted for clarity of illustration. The semiconductor device 50 includes a logic region 50L and a memory region 50M. Memory devices (e.g., MRAM devices) are formed in the memory region 50M and logic devices (e.g., logic circuits) are formed in the logic region 50L. For example, the MRAM array 52 (see FIG. 1) may be formed in the memory region 50M, and the row decoder 54 and the column decoder 56 (see FIG. 1) may be formed in the logic region 50L. The logic region 50L may occupy most of the area of the semiconductor device 50. For example, the logic region 50L may occupy from 95% to 99% of the area of the semiconductor device 50, with the memory region 50M occupying the remaining area of the semiconductor device 50. The memory region 50M may be disposed at an edge of the logic region 50L, or the logic region 50L may surround the memory region 50M.

The logic region 50L and memory region 50M are formed over a substrate, such as a semiconductor substrate 60. The semiconductor substrate 60 may be silicon, which may be doped or un-doped, or may be an active layer of a semiconductor-on-insulator (SOI) substrate. The semiconductor substrate 60 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multilayered or gradient substrates, may also be used.

Devices 62 are formed at an active surface of the semiconductor substrate 60. The devices 62 may be active devices or passive devices. For example, the devices 62 may be transistors, diodes, capacitors, resistors, or the like, formed by any suitable formation method. The devices 62 are interconnected to form memory devices and logic devices of the semiconductor device 50. For example, some of the devices 62 may be access transistors for the MRAM cells 58 (see FIG. 1).

One or more inter-layer dielectric (ILD) layer(s) 64 are formed on the semiconductor substrate 60, and electrically conductive features, such as contact plugs 66, are formed physically and electrically coupled to the devices 62. The ILD layers 64 may be formed of any suitable dielectric material, for example, an oxide such as silicon oxide, phosphosilicate glass (PSG), borosilicate glass (BSG), boron-doped phosphosilicate glass (BPSG), or the like; a nitride such as silicon nitride; or the like. The ILD layers 64 may be formed by any suitable deposition process, such as spin coating, physical vapor deposition (PVD), chemical vapor deposition (CVD), the like, or a combination thereof. The electrically conductive features in the ILD layers 64 may be formed through any suitable process, such as deposition, damascene processes (e.g., single damascene processes, dual damascene processes, or the like), the like, or combinations thereof.

An interconnect structure 68 is formed over the semiconductor substrate 60, such as over the ILD layers 64. The interconnect structure 68 interconnects the devices 62 to form integrated circuits in the logic region 50L and the memory region 50M. The interconnect structure 68 includes multiple metallization layers, such as metallization layers M1-M6. Although six metallization layers M1-M6 are illustrated in FIG. 2, it should be appreciated that more or less metallization layers may be included. Each of the metallization layers M1-M6 includes metallization patterns in dielectric layers. The metallization patterns are electrically coupled to the devices 62 on the semiconductor substrate 60. The metallization patterns include metal lines L1-L6 and metal vias V1-V6, which are formed in inter-metal dielectric (IMD) layers D1-D6. The interconnect structure 68 may formed by a damascene process, such as a single damascene process, a dual damascene process, or the like. In some embodiments, the contact plugs 66 are also part of the metallization patterns, and may form the lowest layer of the metal vias V1.

The MRAM cells 58 of the MRAM array 52 (see FIG. 1) are formed in the interconnect structure 68. The MRAM cells 58 may be formed in any of the metallization layers M1-M6, and are illustrated as being formed in an intermediate metallization layer M5. Each of the MRAM cells 58 includes a conductive via 110, a bottom electrode 117 on the conductive via 110, a magnetic tunnel junction (MTJ) 119 on the bottom electrode 117, and a top electrode 121 on the MTJ 119. An IMD layer 108 may be formed around the MRAM cells 58, with the conductive via 110 extending through the IMD layer 108. Spacers 132 may be formed around the MRAM cells 58. As will be discussed in detail below, the spacers 132 may be formed partially around the MTJ 119, and may be used to protect portions of the MTJ 119 from etching processes, reducing device defects and improving device performance. The IMD layer 108 and/or the spacers 132 surround and protect components of the MRAM cells 58.

Each of the MTJs 119 is provided to store a bit of data in a respective one of the MRAM cells 58. The resistance of each of the MTJs 119 is programmable, and can be changed between a high-resistance state, which may signify a logic "0," and a low-resistance state, which may signify a logic "1." As such, data may be written into the MRAM cells 58 by programming the resistance of the MTJs 119 through corresponding access transistors and data may be read from the MRAM cells 58 by measuring the resistance of the MTJs 119 through corresponding access transistors.

The MRAM cells 58 are electrically coupled to the devices 62. The conductive via 110 is physically and electrically coupled to an underlying metallization pattern, such as the metal lines L4 in the illustrated example. The top electrode 121 is physically and electrically coupled to an overlying metallization pattern, such as the metal vias V6 in the illustrated example. As illustrated in FIG. 1, the MRAM cells 58 are arranged in an MRAM array 52 having rows and columns of memory. The metallization patterns include access lines (e.g., word lines and bit lines) for the MRAM array 52. For example, the metallization patterns underlying the MRAM cells 58 (e.g., metallization patterns M1-M4) can include word lines disposed along the rows of the MRAM array 52 and the metallization patterns overlying the MRAM cells 58 (e.g., metallization pattern M6) can include bit lines disposed along the columns of the MRAM array 52. Some of the devices 62, such as devices of the row decoder 54 (e.g., access transistors), are electrically coupled to the word lines of the MRAM array 52. The top electrodes 121 are electrically coupled to other devices, such as devices of the column decoder 56, by the bit lines of the MRAM array 52.

FIGS. 3 through 18 are cross-sectional views of intermediate stages in the manufacturing of the semiconductor device 50, in accordance with some embodiments. Specifically, FIGS. 3 through 18 illustrate the manufacturing of the interconnect structure 68 (see FIG. 2) for the semiconductor device 50. As noted above, the interconnect structure 68 includes the MRAM cells 58 of the MRAM array 52 (see FIG. 1).

Figure 3:
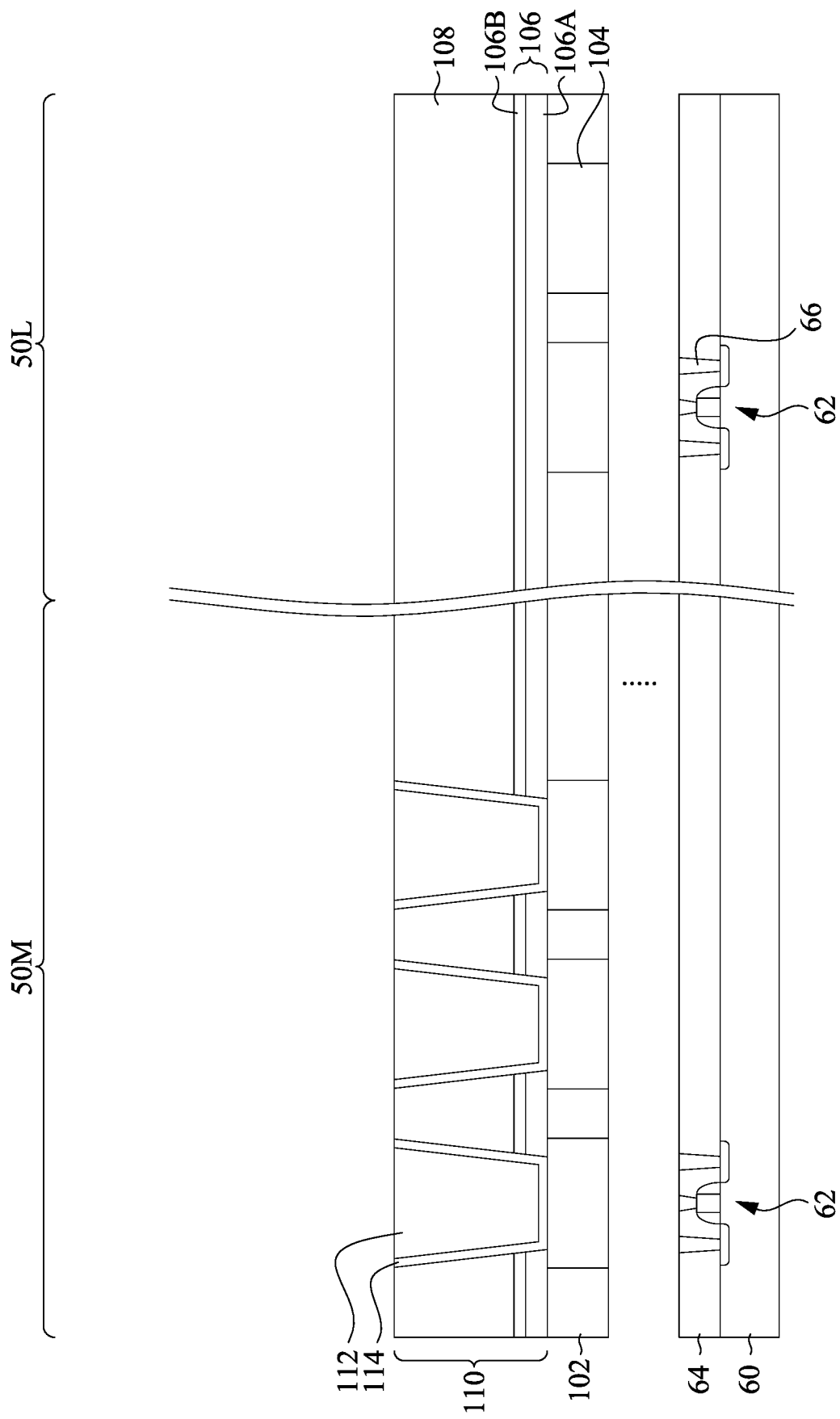
FIGS. 3, 4, 5, 6, 7, 8, 9, 10, 11, 12, 13, 14, 15A, 15B, 16A, 16B, 17, and 18 are cross-sectional views of intermediate stages in the manufacturing of semiconductor devices, in accordance with some embodiments.

In FIG. 3, a metallization layer (e.g., M4 illustrated in FIG. 2) of the interconnect structure 68 is formed over the ILD layer 64 and the contact plugs 66. The metallization layer M4 comprises an IMD layer 102 (corresponding to the IMD layer D4 in FIG. 4) and conductive features 104 (corresponding to the metal lines L4 in FIG. 2). The IMD layer 102 may be formed of any suitable dielectric material, for example, an oxide such as silicon oxide, phosphosilicate glass (PSG), borosilicate glass (BSG), boron-doped phosphosilicate glass (BPSG), or the like; a nitride such as silicon nitride; combinations thereof; or the like. The IMD layer 102 may be formed by any acceptable deposition process, such as spin coating, PVD, CVD, the like, or a combination thereof. The IMD layer 102 may be formed of a low-k dielectric material having a k-value lower than about 3.0. The IMD layer 102 may be formed of an extra-low-k (ELK) dielectric material having a k-value of less than 2.5.

Conductive features 104 are formed in the IMD layer 102, and are electrically coupled to the devices 62. In some embodiments, the conductive features 104 include one or more diffusion barrier layers and a conductive fill material over the diffusion barrier layers. Openings are formed in the IMD layer 102 using one or more etching processes. The openings expose underlying conductive features, such as underlying metal vias. The diffusion barrier layers may be formed of tantalum nitride, tantalum, titanium nitride, titanium, cobalt-tungsten, or the like. The diffusion barrier layers may be formed in the openings by a deposition process such as atomic layer deposition (ALD) or the like. The conductive fill material may include copper, aluminum, tungsten, silver, combinations thereof, or the like. The conductive fill material may be formed over the diffusion barrier layers in the openings by an electro-chemical plating process, CVD, ALD, PVD, the like, or a combination thereof. In an embodiment, the conductive fill material is copper, and the diffusion barrier layers are thin barrier layers that prevent the copper from diffusing into the IMD layer 102. After formation of the diffusion barrier layers and the conductive fill material, excess material of the diffusion barrier layers and conductive fill material may be removed by, for example, a planarization process such as a chemical mechanical polish (CMP) process.

An etch stop layer 106 is formed over the conductive features 104 and IMD layer 102. The etch stop layer 106 may be referred to as a buffer layer. The etch stop layer 106 may be formed of a dielectric material such as aluminum nitride, aluminum oxide, silicon oxide, silicon nitride, silicon oxynitride, silicon carbide (SiC), silicon carbonitride, silicon oxycarbonitride, silicon oxycarbide (SiOC), a combination thereof, or the like. The etch stop layer 106 may be formed by CVD, PVD, ALD, a spin-on coating process, the like, or a combination thereof. The etch stop layer 106 may also be a composite layer formed of a plurality of dielectric sub-layers. For example, the etch stop layer 106 may include a silicidation blocking sub-layer 106A (such as a layer of silicon nitride, silicon carbide, silicon oxycarbide, silicon carbonitride, silicon oxycarbonitride, the like, or a combination thereof) and an aluminum oxide sub-layer 106B formed on the silicidation blocking sub-layer 106A. In such embodiments, the aluminum oxide sub-layer 106B may have a thickness in a range of 10 Å to 40 Å, and the silicidation blocking sub-layer 106A may have a thickness in a range of 10 Å to 150 Å. The silicidation blocking sub-layer 106A may reduce the formation of excess silicide during the subsequent formation of conductive contacts, which may be useful in reducing leakage current through a path provided by the excess silicide. The silicidation blocking sub-layer 106A may further act as an etch stop layer and may be used as an adhesion layer to improve adhesion between the underlying layer and the aluminum oxide sub-layer 106B.

An IMD layer 108 is formed on the etch stop layer 106. In some embodiments, the IMD layer 108 is formed of a silicon oxide deposited using CVD or the like. The IMD layer 108 may be formed from a precursor such as tetraethyl orthosilicate (TEOS). The IMD layer 108 may be a silicon-rich oxide (SRO). In some embodiments, the IMD layer 108 may be formed of PSG, BSG, BPSG, undoped silicate glass (USG), fluorosilicate glass (FSG), SiOCH, a flowable oxide, a porous oxide, the like, or combinations thereof. The IMD layer 108 may be formed of a low-k dielectric material (e.g., a dielectric material having a k-value lower than about 3.0). The IMD layer 108 may be formed to a thickness ranging from about 100 Å to about 900 Å.

Conductive vias 110 are formed extending through the IMD layer 108 and the etch stop layer 106. The conductive vias 110 may be referred to as bottom electrode vias. In some embodiments, the conductive vias 110 include a conductive fill material 112 and conductive barrier layers 114 lining sidewalls and bottom surfaces of the conductive fill material 112. The conductive barrier layers 114 may be formed of titanium, titanium nitride, tantalum, tantalum nitride, cobalt, a combination thereof, or the like. The conductive fill material 112 may be formed of metals such as copper, aluminum, tungsten, cobalt, alloys thereof, or the like. The formation of the conductive vias 110 may include etching the IMD layer 108 and etch stop layer 106 to form via openings, depositing the conductive barrier layers 114 over the IMD layer 108 and the etch stop layer 106 and extending into the via openings, depositing the conductive fill material 112 over the conductive barrier layers 114, and performing a planarization process, such as a CMP process or a mechanical grinding process, to remove excess portions of the conductive barrier layers 114 and the conductive fill material 112, such as portions of the conductive barrier layers 114 and the conductive fill material 112 extending over the IMD layer 108.

Figure 4:
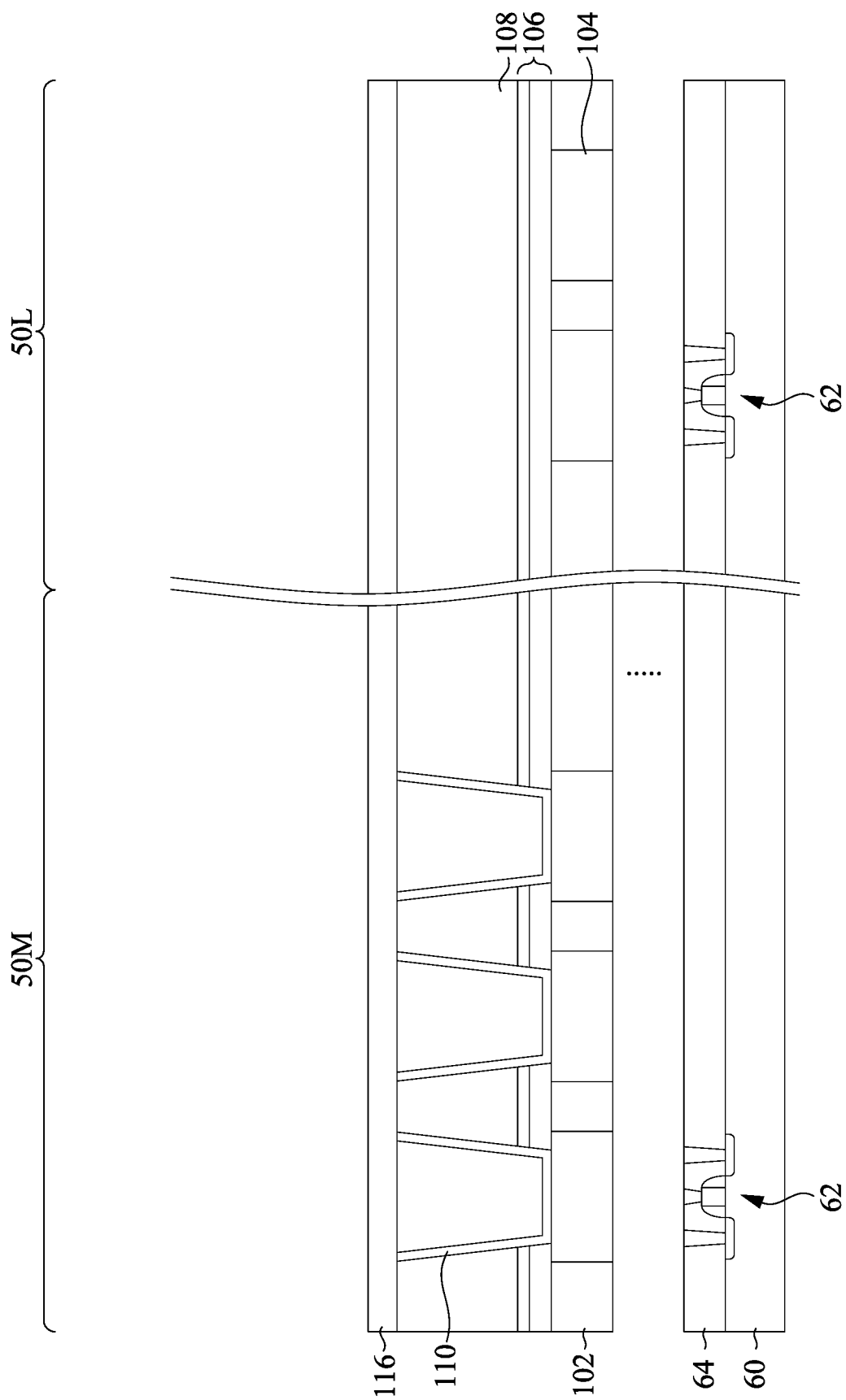

In FIG. 4, a bottom electrode layer 116 is formed over the conductive vias 110 and the IMD layer 108. The bottom electrode layer 116 is formed of a conductive material such as titanium (Ti), tantalum (Ta), aluminum (Al), tungsten (W), platinum (Pt), nickel (Ni), chromium (Cr), ruthenium (Ru), nitrides thereof, combinations or multiple layers thereof, or the like. The bottom electrode layer 116 may be deposited by a conformal deposition process, such as CVD, PVD, ALD, electro-chemical plating, electroless plating, or the like. In some embodiments, the bottom electrode layer 116 has a thickness ranging from about 50 Å to about 150 Å.

Figure 5:
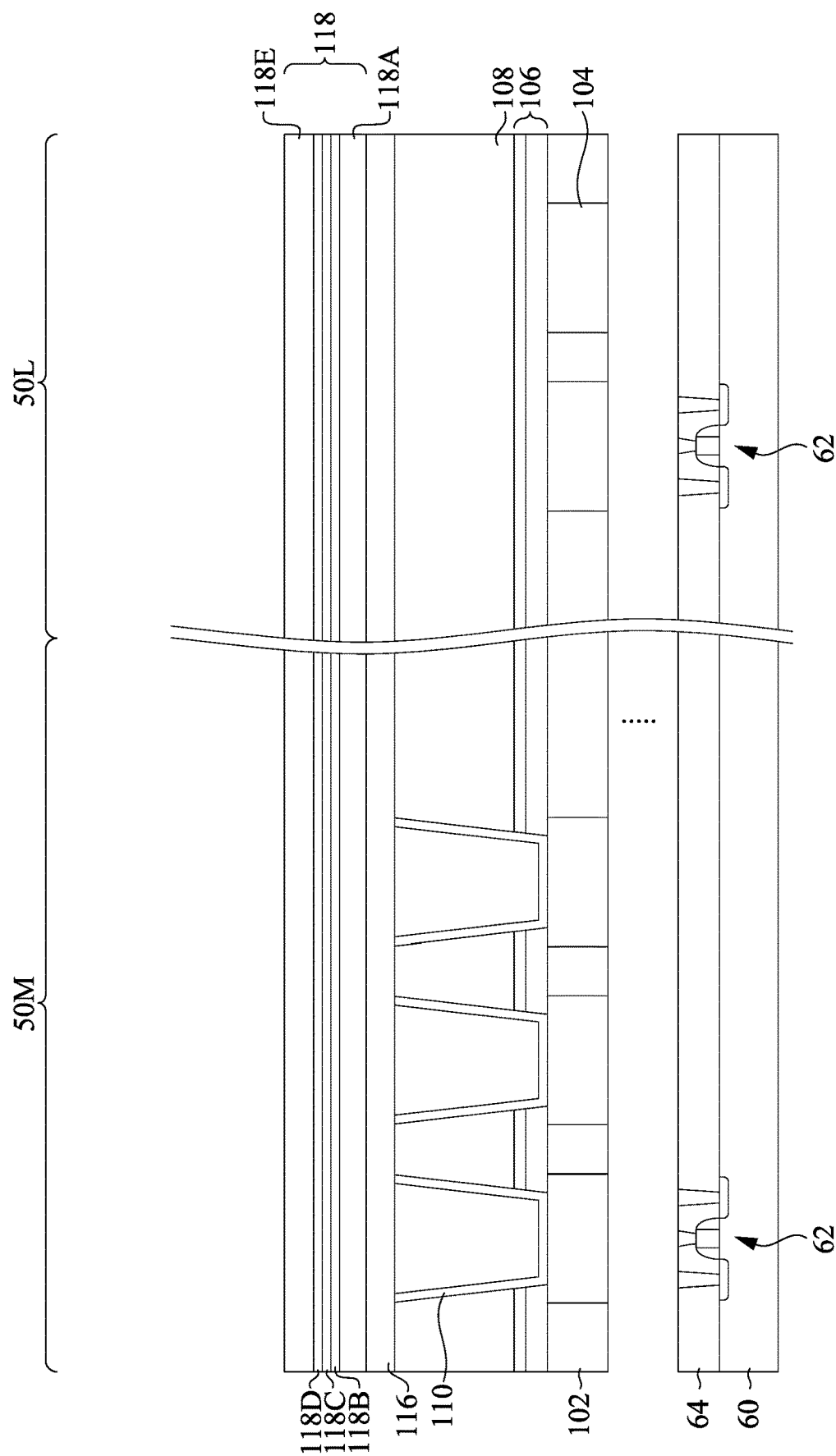

In FIG. 5, a metallic tunnel junction (MTJ) film stack 118 is formed over the bottom electrode layer 116. The MTJ film stack 118 is a multi-layer film stack that includes a reference layer 118A over the bottom electrode layer 116, a tunnel barrier layer 118B over the reference layer 118A, a free layer 118C over the tunnel barrier layer 118B, a maintenance layer 118D over the free layer 118C, and a capping layer 118E over the maintenance layer 118D. In some embodiments, the MTJ film stack 118 has an overall thickness ranging from about 200 Å to about 250 Å. Each layer of the MTJ film stack 118 may be deposited using one or more deposition methods such as, CVD, PVD, ALD, a combination thereof, or the like.

The reference layer 118A may be formed of a ferromagnetic material alloy, such as cobalt iron (CoFe), cobalt iron boron (CoFeB), a cobalt and platinum multi-layer (Co/Pt), a combination thereof, or the like. The reference layer 118A may have a thickness ranging from about 15 Å to about 100 Å. The tunnel barrier layer 118B may be formed of a dielectric material, such as magnesium oxide (MgO), aluminum oxide, aluminum nitride, aluminum oxynitride, a combination thereof, or the like. The tunnel barrier layer 118B may have a thickness ranging from about 5 Å to about 20 Å. The thickness of the tunnel barrier layer 118B contributes to the relative difference between the low-resistance state and the high-resistance state in the resulting MRAM cells 58. The free layer 118C may be formed of a ferromagnetic material alloy, such as cobalt iron boron (CoFeB) or the like. The free layer 118C may be formed of a ferromagnetic material with a lower coercivity field than the reference layer 118A. The free layer 118C may have a thickness ranging from about 5 Å to about 25 Å.

The electrical resistance through the MTJ film stack 118 varies depending on magnetic orientations of the reference layer 118A and the free layer 118C, and this phenomenon is used to store data in the resulting MRAM cells 58. The reference layer 118A may be a permanent magnet, which is set to a fixed polarity, while the magnetic polarity of the free layer 118C can be changed by application of an electrical field. When the polarity of the free layer 118C matches the polarity of the reference layer 118A, the MRAM cell 58 is in the low-resistance state. When the polarity of the free layer 118C is opposite the polarity of the reference layer 118A, the MRAM cell 58 is in the high-resistance state.

The maintenance layer 118D may function to maintain the magnetic moment of the free layer 118C in a fixed direction. The maintenance layer 118D may be formed of a dielectric material, such as magnesium oxide (MgO), and may have a thickness ranging from about 5 Å to about 20 Å. The capping layer 118E may be the outermost layer (e.g., the topmost layer) of the MTJ film stack 118. The capping layer 118E may protect the underlying layers from etching damage and/or oxidation. In some embodiments, the capping layer 118E is formed of a conductive material, such as molybdenum, ruthenium, combinations or multiple layers thereof, or the like. In some embodiments, the capping layer 118E is formed of an insulating material. The insulating material may be substantially oxygen-free, and may include silicon nitride. The capping layer 118E may have a thickness ranging from about 10 Å to about 100 Å.

It should be appreciated that the materials and the structure of the MTJ film stack 118 may have many variations, which are also within the scope of the present disclosure. For example, the layers 118A-118E may be formed in an order inversed from that described above. Accordingly, the capping layer 118E may be the bottom layer of the MTJ film stack 118, and the reference layer 118A may be the top layer of the MTJ film stack 118. Further, in some embodiments, only the order of certain layers of the MTJ film stack 118 may be inversed, such as the order of the reference layer 118A and the free layer 118C being reversed (see the description related to FIGS. 16A and 16B, below).

Figure 6:
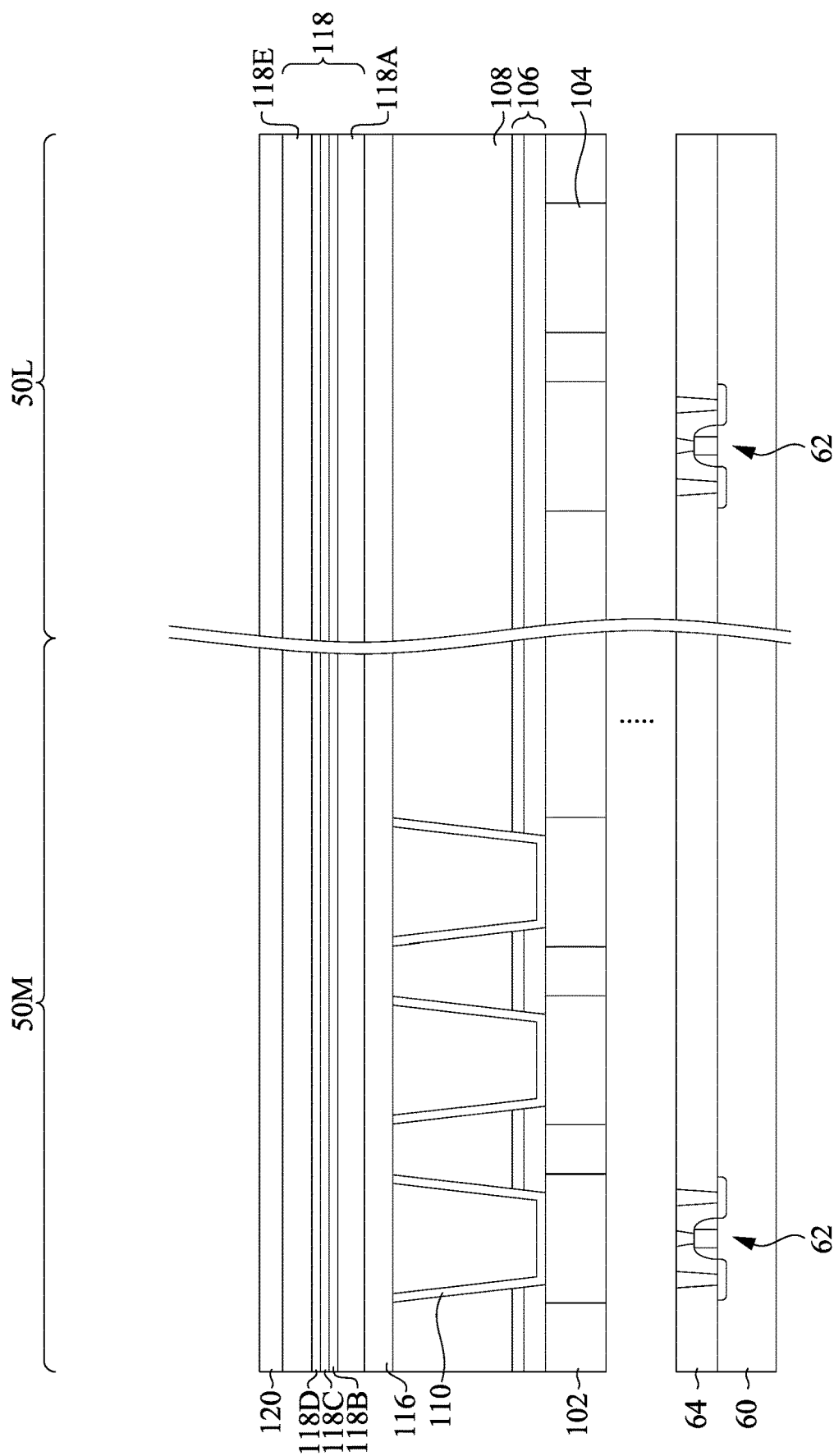

In FIG. 6, a top electrode layer 120 is formed over the MTJ film stack 118. In some embodiments, the top electrode layer 120 is formed as a blanket layer, and may be formed using CVD, PVD, ALD, electro-chemical plating, electro-less plating, or the like. The top electrode layer 120 is a conductive layer, and may formed of a conductive material such as titanium (Ti), tantalum (Ta), aluminum (Al), tungsten (W), platinum (Pt), nickel (Ni), chromium (Cr), ruthenium (Ru), nitrides thereof, combinations or multiple layers thereof, or the like. The top electrode layer 120 may have a thickness ranging from about 400 Å to about 800 Å. In some embodiments, the top electrode 120 may have a thickness greater than a thickness of the bottom electrode layer 116. The top electrode layer 120 may be used as a hard mask in the subsequent patterning of the MTJ film stack 118.

Figure 7:
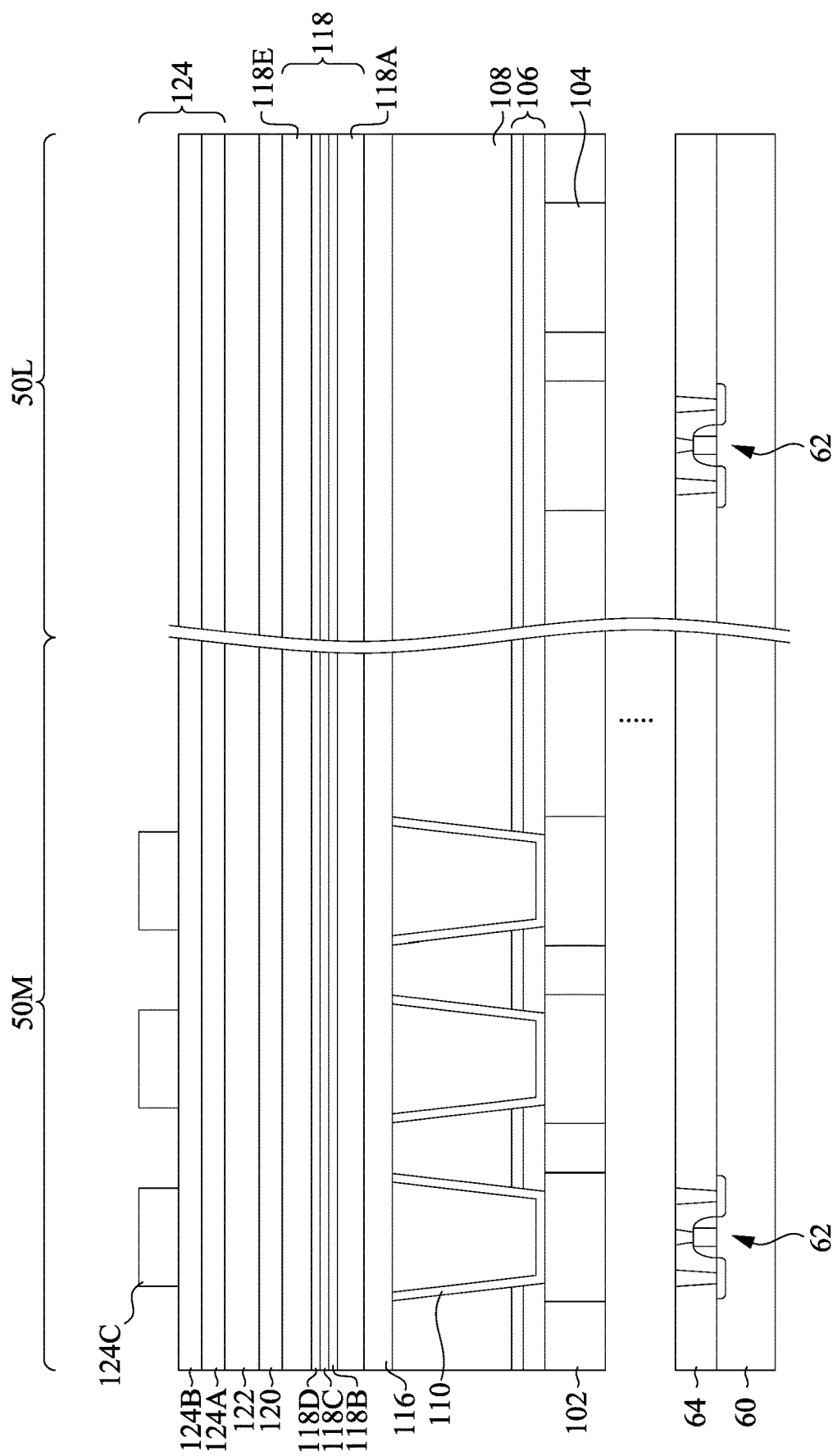

In FIG. 7, one or more masks are formed over the top electrode layer 120. The masks may be used to pattern the various layers used to form the MRAM cells 58 (see FIG. 1). In some embodiments, the one or more masks comprise one or more hard masks, photoresists, or the like. Any suitable mask layers with any suitable compositions may be used. For example, a hard mask layer 122 can be formed over the top electrode layer 120 and a photoresist 124 can be formed over the hard mask layer 122.

The hard mask layer 122 may be formed of an oxide, such as silicon oxide, a nitride, such as silicon nitride, or the like. The hard mask layer 122 may be deposited by CVD, ALD, or the like. In some embodiments, the hard mask layer 122 is formed of silicon oxide using TEOS as a precursor. The hard mask layer 122 may have a thickness ranging from about 100 Å to about 500 Å.

The photoresist 124 may be any acceptable photoresist, such as a single-layer photoresist, a bi-layer photoresist, a tri-layer photoresist, or the like. In the illustrated embodiment, the photoresist 124 is a tri-layer photoresist including a bottom layer 124A, a middle layer 124B, and a top layer 124C. In some embodiments, the bottom layer 124A is formed of amorphous carbon; the middle layer 124B is formed of amorphous silicon; and the top layer 124C is formed of a photosensitive material. The top layer 124C is patterned in the memory region 50M, with the pattern of the top layer 124C corresponding to the pattern of the subsequently formed MRAM cells 58.

Figure 8:
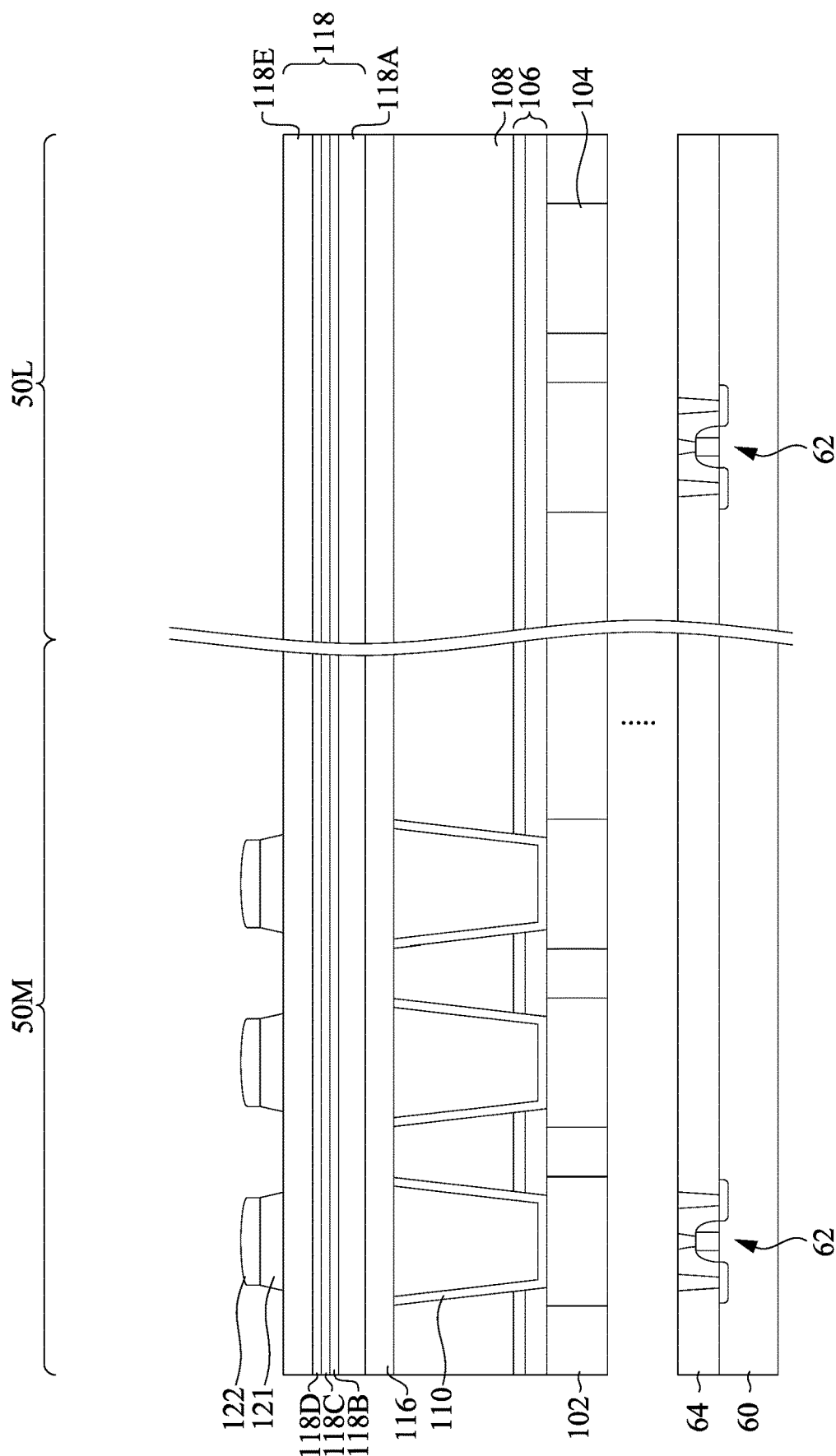

In FIG. 8, the photoresist 124 is used as an etching mask to etch and pattern the hard mask layer 122. The hard mask layer 122 is then used an etching mask to etch and pattern the top electrode layer 120, forming top electrodes 121. The hard mask layer 122 and the top electrode layer 120 may be etched by suitable etching processes, such as anisotropic etching processes. In some embodiments, the hard mask layer 122 and the top electrode layer 120 may be etched by plasma etching processes, such as reactive ion etching (RIE), ion beam etching (IBE), or the like. As illustrated in FIG. 8, the hard mask layer 122 may have a reduced thickness after etching, and may have a domed top surface. The top electrodes 121 may have tapered side surfaces, which narrow in a direction away from the semiconductor substrate 60. One or more layers of the photoresist 124 may be consumed in the etching process, or may be removed after the etching process. After the etching processes, top surfaces and side surfaces of the hard mask layer 122, side surfaces of the top electrodes 121, and top surfaces of the MTJ film stack 118 (such as top surfaces of the capping layer 118E) may be exposed.

Figure 9:
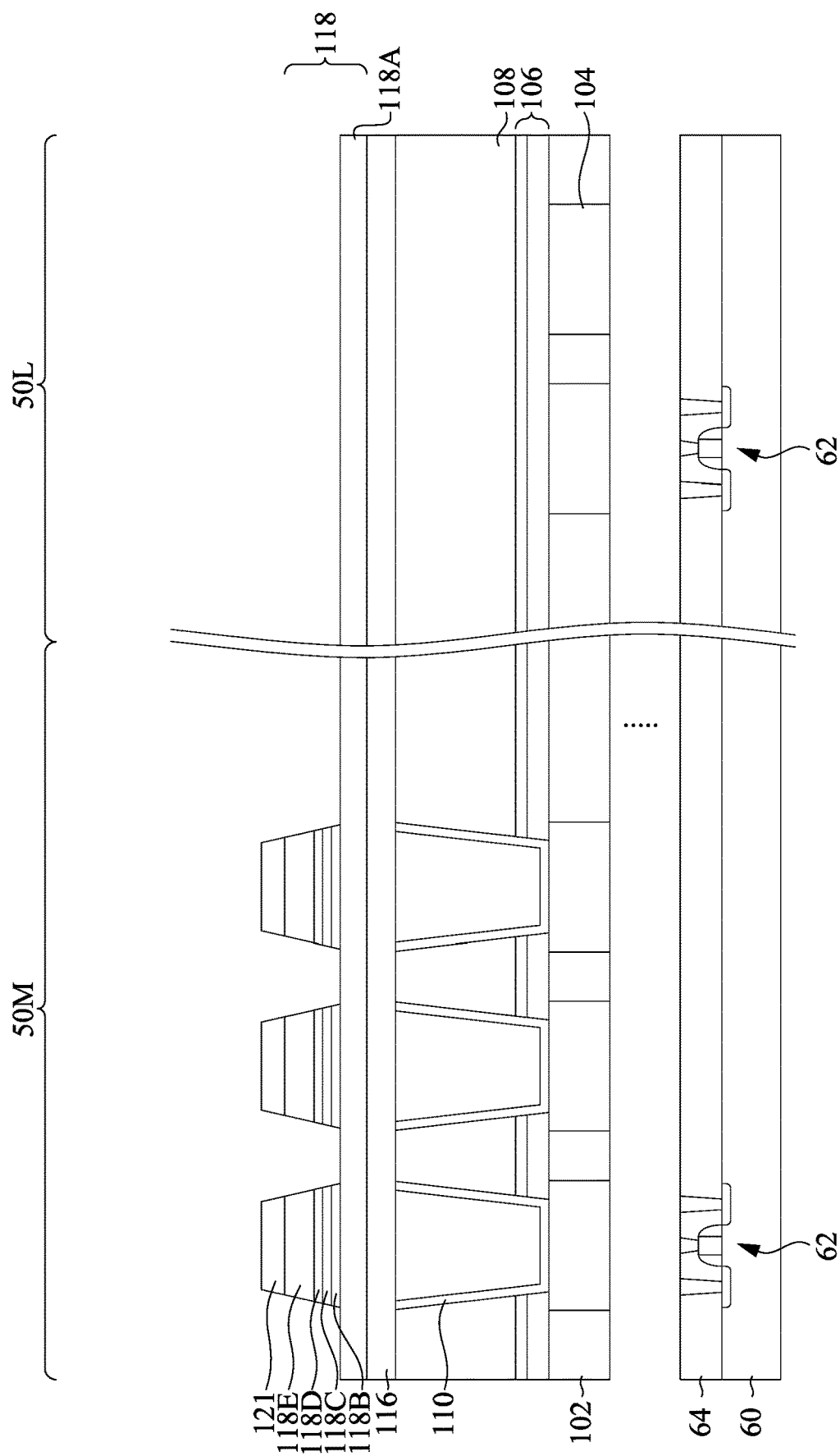

In FIG. 9, the hard mask layer 122 and the top electrodes 121 are used as etching masks to etch and pattern various layers of the MTJ film stack 118. As illustrated in FIG. 9, the patterning may etch through the capping layer 118E, the maintenance layer 118D, the free layer 118C, and the tunnel barrier layer 118B to expose top surfaces of the reference layer 118A. The patterning may include one or more etching processes and may include plasma etching processes, such as IBE.

In some embodiments, the patterning may include a first main etching process, which is a low-angle IBE process. The first main etching process may be an IBE process performed at an angle of incidence of less than 30°. The first main etching process may use an inert gas, such as argon (Ar), xenon (Xe), combinations thereof, or the like as the ion beam source. The first main etching process may be performed until the tunnel barrier layer 118B is broken through. The first main etching process may be performed for a duration ranging from about 50 seconds to about 300 seconds. A high-angle trimming process is then performed to remove byproducts deposited along side surfaces of the layers of the MTJ film stack 118 (such as side surfaces of the capping layer 118E, the maintenance layer 118D, the free layer 118C, and the tunnel barrier layer 118B). The high-angle trimming process may be an IBE process performed at an angle of incidence of greater than 30°. A low-angle trimming process may be performed to repair damage to the MTJ film stack 118 caused by the high-angle trimming process and to recover magnetic properties of the MTJ film stack 118 (e.g., the low-angle trimming process may be used to improve switching characteristics of the MTJ film stack 118). The low-angle trimming process may be an IBE process performed at an angle of incidence of less than 30°. The high-angle trimming process and the low-angle trimming process may use an inert gas, such as argon (Ar), xenon (Xe), combinations thereof, or the like as the ion beam source. As illustrated in FIG. 9, the top electrodes 121, the capping layer 118E, the maintenance layer 118D, the free layer 118C, and the tunnel barrier layer 118B may have tapered side surfaces, which narrow in a direction away from the semiconductor substrate 60.

The total etch time of the high-angle trimming process and the low-angle trimming process may be less than about 200 seconds. Keeping the total etch time for the high-angle trimming process and the low-angle trimming process under 200 seconds prevents the high-angle trimming process from damaging magnetic properties of the MTJ film stack 118 (e.g., prevents switching characteristics of the MTJ film stack 118 from being deteriorated) and prevents byproducts from the low-angle trimming processes from causing shorts between portions of the MTJ film stack 118. This reduces device defects in completed devices and improves performance of completed devices. The hard mask layer 122 may be consumed during the etching processes, or may be removed after the etching processes.

Figure 10:
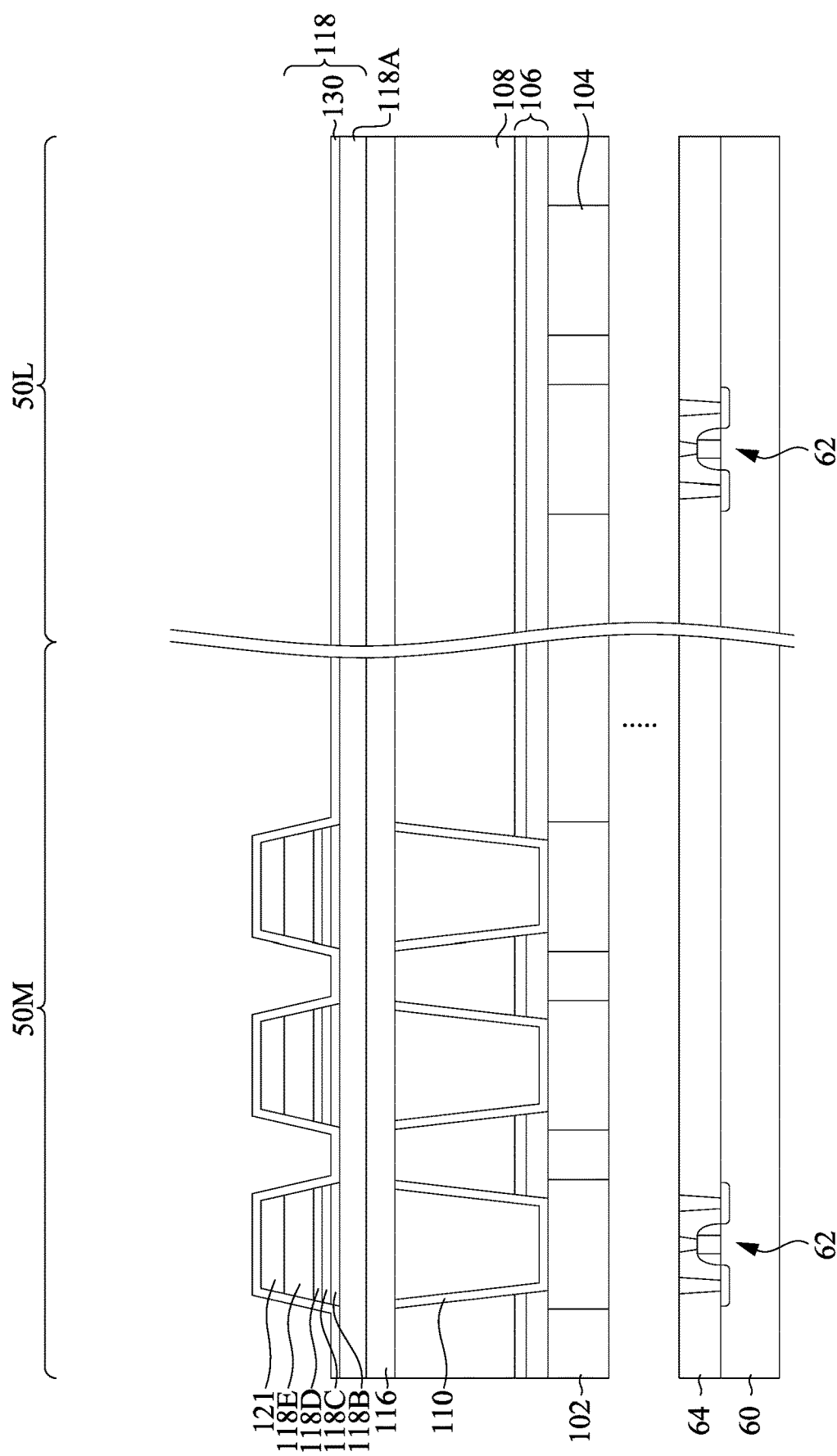

In FIG. 10, a spacer layer 130 is formed over the top electrodes 121 and the MTJ film stack 118. The spacer layer 130 may be deposited by a conformal process, such as CVD, ALD, or the like. The spacer layer 130 may be deposited along top surfaces and side surfaces of the top electrodes 121; side surfaces of the capping layer 118E, the maintenance layer 118D, the free layer 118C, and the tunnel barrier layer 118B; and top surfaces of the reference layer 118A. The spacer layer 130 may comprise a dielectric material, such as silicon oxide, silicon nitride, or the like. The spacer layer 130 may be deposited to a thickness ranging from about 100 Å to about 150 Å. As illustrated in FIG. 10, the spacer layer 130 may be deposited in both the memory region 50M and the logic region 50L.

Figure 11:
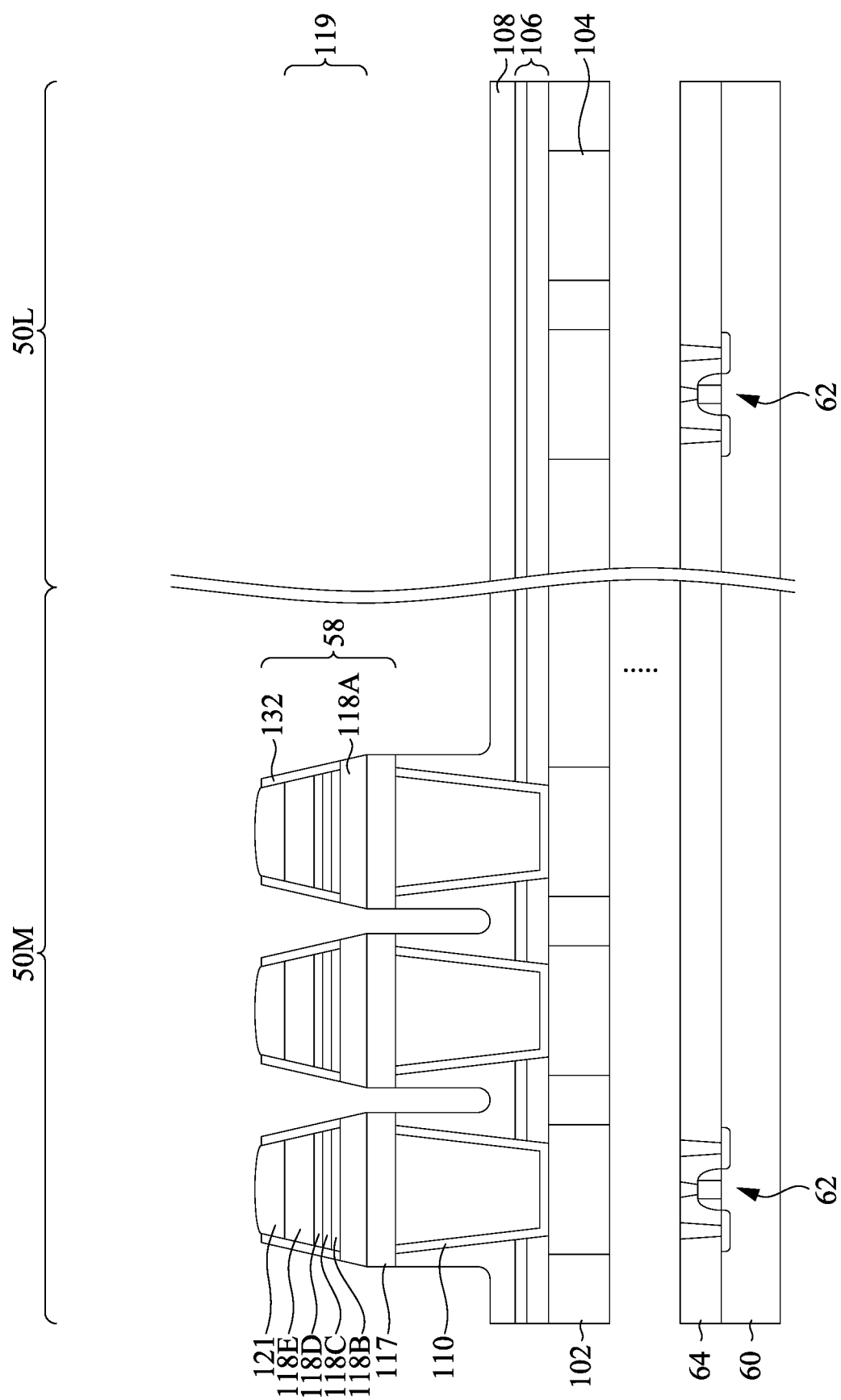

In FIG. 11, the spacer layer 130, the reference layer 118A, the bottom electrode layer 116, and the IMD layer 108 are etched and patterned. The patterning may include one or more anisotropic etching processes. In some embodiments, the one or more anisotropic etching processes may include plasma etching processes, such as IBE. In some embodiments, the patterning may include a second main etching process, which is a low-angle IBE process. The second main etching process may use an inert gas, such as argon (Ar), xenon (Xe), combinations thereof, or the like as the ion beam source. The patterning may etch through the spacer layer 130 to form spacers 132, which are then used in combination with the top electrodes 121 as masks to etch through the reference layer 118A and the bottom electrode layer 116 and into the IMD layer 108. The second main etching process may be performed for a duration ranging from about 50 seconds to about 300 seconds. Etching through the reference layer 118A forms magnetic tunnel junctions (MTJs) 119, which comprise the reference layer 118A, the tunnel barrier layer 118B, the free layer 118C, the maintenance layer 118D, and the capping layer 118E. Etching through the bottom electrode layer 116 forms bottom electrodes 117. The bottom electrodes 117, the MTJs 119, and the top electrodes 121 may be collectively referred to as MRAM cells 58.

As illustrated in FIG. 11, the spacers 132 may remain along side surfaces of the top electrodes 121, the capping layer 118E, the maintenance layer 118D, the free layer 118C, and the tunnel barrier layer 118B and along portions of top surfaces of the reference layer 118A. The spacers 132 may have sloped inner side surfaces and outer side surfaces. The side surfaces of the spacers 132 may be continuous with tapered side surfaces of the reference layer 118A. Top surfaces of the spacers 132 may be disposed below top surfaces of the top electrodes 121. The top electrodes 121 may have convex top surfaces following the second main etching process, as illustrated in FIG. 11; however, in some embodiments, the top electrodes 121 may have flat or concave top surfaces following the second main etching process. The reference layer 118A may have tapered side surfaces, which narrow in a direction away from the semiconductor substrate 60. Because the spacers 132 protect sidewalls of the capping layer 118E, the maintenance layer 118D, the free layer 118C, and the tunnel barrier layer 118B, the MTJs 119 may have a stepped structure, with a width of the MTJs 119 widening at the top of the reference layer 118A. Side surfaces of the bottom electrodes 117 may be vertical, as illustrated in FIG. 11, or may be tapered and may narrow in a direction away from the semiconductor substrate 60. The IMD layer 108 may include vertical sidewalls and top surfaces of the IMD layer may include U-shaped portions, V-shaped portions, horizontal portions, combinations thereof, or the like.

Providing the spacers 132 along side surfaces of the MTJs 119 prevents damage to the MTJs 119 from the second main etching process. This improves the magnetic properties of the MTJs 119 (e.g., improves switching characteristics of the MTJs 119), prevents shorts from occurring between adjacent portions of the MTJs 119, reduces device defects, and improves device performance.

Figure 12:
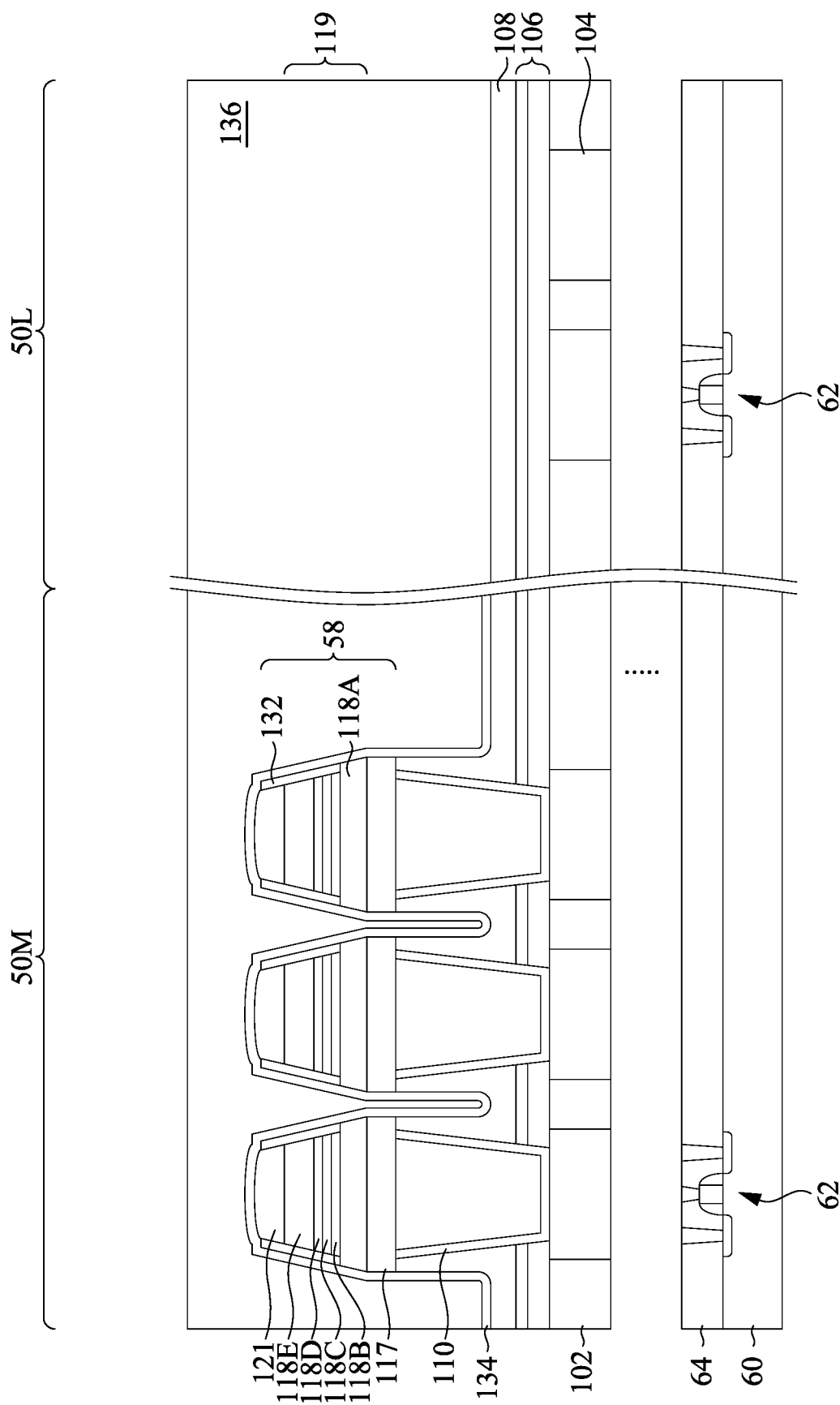

In FIG. 12, a protection layer 134 is formed over the memory region 50M and an IMD layer 136 is formed over the memory region 50M and the logic region 50L. Although the protection layer 134 is only illustrated as extending over the memory region 50M, in some embodiments, the protection layer 134 may also extend over the logic region 50L. In some embodiments, the protection layer 134 may be formed of a dielectric material, such as aluminum oxide (AlOx), silicon nitride, silicon oxide, silicon oxynitride, combinations or multiple layers thereof, or the like. The protection layer 134 may be deposited by a conformal deposition process, such as CVD, ALD, the like, or a combination thereof. The protection layer 134 may be deposited along top surfaces and side surfaces of the IMD layer 108 and the spacers 132; along top surfaces of the top electrodes 121; and along side surfaces of the reference layer 118A and the bottom electrodes 117. In some embodiments, the protection layer 134 may be removed from the logic region 50L by suitable patterning and etching processes. The protection layer 134 may be used to protect the MRAM cells 58. For example, the protection layer 134 help reduce moisture (e.g., H₂O) and hydrogen diffusion into the MRAM cells 58 during subsequent processing. The protection layer 134 may have a thickness ranging from about 30 Å to about 500 Å.

The IMD layer 136 is then deposited over the memory region 50M and the logic region 50L. In some embodiments, the IMD layer 136 is formed of a silicon oxide deposited using CVD or the like. The IMD layer 136 may be formed from a precursor such as TEOS. In some embodiments, the IMD layer 136 may be formed of PSG, BSG, BPSG, USG, FSG, SiOCH, a flowable oxide, a porous oxide, the like, or combinations thereof. The IMD layer 136 may be formed of a low-k dielectric material (e.g., a dielectric material having a k-value lower than about 3.0) or an extra low-k dielectric material. The IMD layer 136 may be deposited by CVD, ALD, spin-on coating, or the like.

Figure 13:
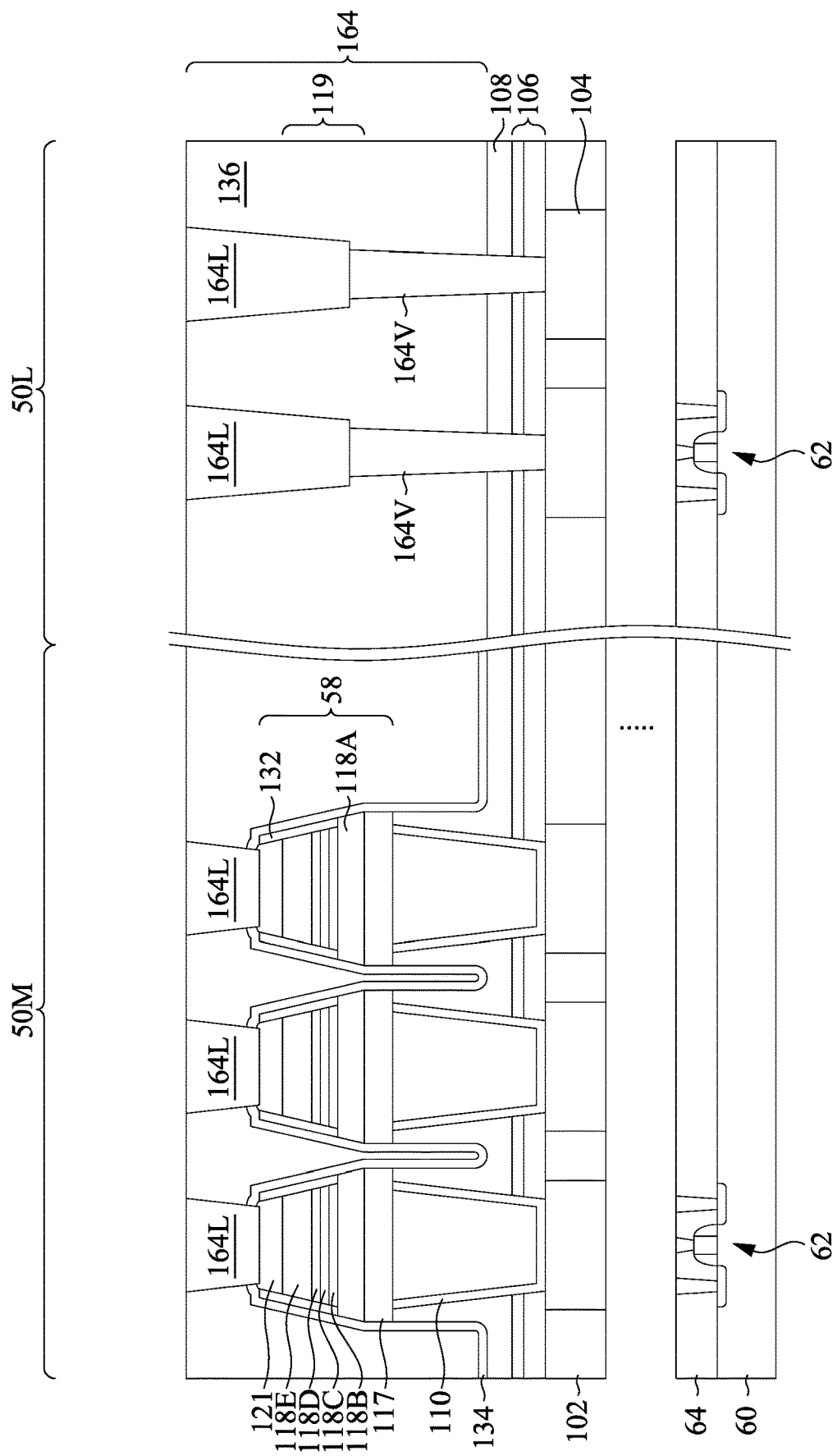

In FIG. 13, conductive features 164 are formed in the IMD layer 136 and the protection layer 134. The conductive features 164 may be electrically coupled to the MRAM cells 58 in the memory region 50M and the conductive features 104 in the logic regions 50L. The conductive features 164 may include conductive lines 164L in the memory region 50M and the logic region 50L and conductive vias 164V in the logic region 50L. The conductive features 164 may be formed by suitable methods, such as damascene processes. In some embodiments, the conductive features may be formed by single damascene processes, dual damascene processes, and the like. In some embodiments, openings for the conductive features 164 are formed by a via-first process. In some embodiments, openings for the conductive features 164 are formed by a trench-first process. The openings may be formed using suitable photolithography and etching techniques. The openings may be filled with suitable conductive materials, such as copper, aluminum, combinations thereof, or the like. After the conductive materials are deposited, a planarization process, such a CMP process, is performed to remove excess materials, such as materials extending over the IMD layer 136. In some embodiments, the top surfaces of the conductive features 164 are level with top surfaces of the IMD layer 136. As illustrated in FIG. 13, bottom surfaces of the conductive lines 164L in the memory region 50M may be disposed above bottom surfaces of the conductive lines 164L in the logic region 50L and top surfaces of the top electrodes 121 may be disposed above top surfaces of the conductive vias 164V. Although the conductive vias 164V and the conductive lines 164L are illustrated as being separate elements, in some embodiments, the conductive vias and the conductive lines may be continuous conductive features, such as in embodiments in which the conductive vias and the conductive lines are formed by a dual damascene process.

Forming the spacers 132 along side surfaces of the capping layer 118E, the maintenance layer 118D, the free layer 118C, and the tunnel barrier layer 118B after etching through the tunnel barrier layer 118B and before etching through the reference layer 118A protects the side surfaces of the capping layer 118E, the maintenance layer 118D, the free layer 118C, and the tunnel barrier layer 118B after etching through the tunnel barrier layer 118B from subsequent etching processes. This prevents damage to the magnetic properties of the MRAM cells 58 (e.g., prevents switching characteristics of the MRAM cells 58 from being deteriorated), prevents conductive byproducts from being deposited on the side surfaces of the capping layer 118E, the maintenance layer 118D, the free layer 118C, and the tunnel barrier layer 118B after etching through the tunnel barrier layer 118B, and prevents shorts between the MRAM cells 58. This reduces device defects and improves device performance.

Figure 14:
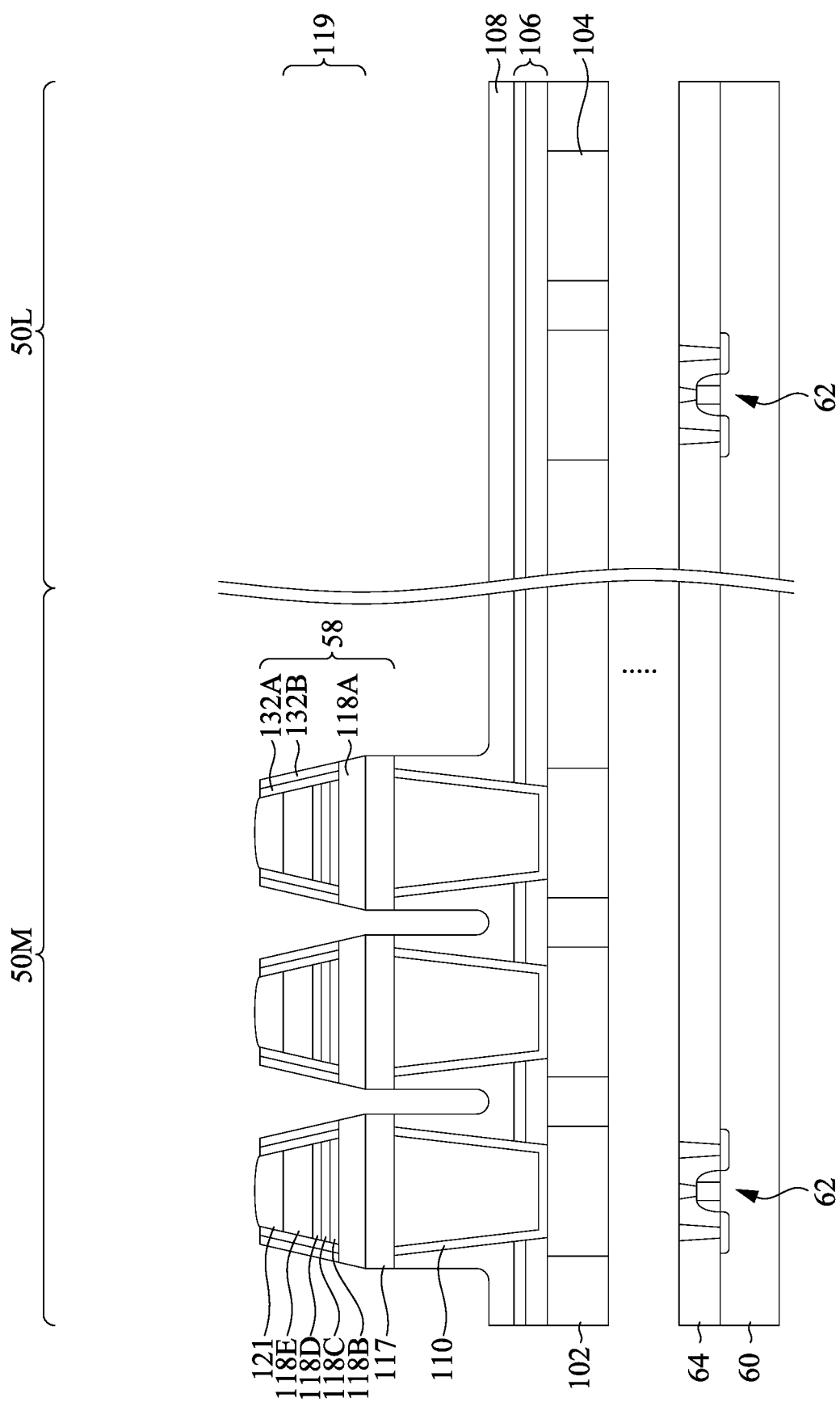

FIGS. 14 through 18 illustrate embodiments with varying configurations of the spacers 132 and the layers of the MTJs 119. In FIG. 14, the spacers 132 comprise multiple layers of spacer material. More specifically, the spacers 132 include a first spacer layer 132A and a second spacer layer 132B. The first spacer layer 132A may be conformally deposited over the structure illustrated in FIG. 9, as described above with respect to FIG. 10 for the spacer layer 130, and the second spacer layer 132B may be conformally deposited over the first spacer layer 132A. The first spacer layer 132A and the second spacer layer 132B may be deposited by CVD, ALD, or the like. The first spacer layer 132A and the second spacer layer 132B may comprise dielectric materials, such as silicon oxide, silicon nitride, or the like. In some embodiments, the first spacer layer 132A and the second spacer layer 132B may comprise the same materials. In some embodiments, the first spacer layer 132A and the second spacer layer 132B may comprise different materials. The first spacer layer 132A may be deposited by ALD, and the second spacer layer 132B may be deposited by CVD.

Depositing the first spacer layer 132A by ALD improves the adhesion of the first spacer layer 132A to the MTJ film stack 118 (e.g., to the capping layer 118E, the maintenance layer 118D, the free layer 118C, and the tunnel barrier layer 118B). Depositing the second spacer layer 132B reduces costs of forming the spacers 132. The first spacer layer 132A may have a thickness ranging from about 50 Å to about 300 Å and the second spacer layer 132B may have a thickness ranging from about 50 Å to about 300 Å. Side surfaces of the second spacer layer 132B may be continuous with tapered side surfaces of the reference layer 118A. The MTJs 119 include a first tapered portion including the capping layer 118E, the maintenance layer 118D, the free layer 118C, and the tunnel barrier layer 118B, a step portion on a top surface of the reference layer 118A, and a second tapered portion including the reference layer 118A. The processes of FIGS. 12 and 13 may then be performed on the structure of FIG. 14 to form a final structure similar to the structure of FIG. 13.

In FIGS. 15A through 16B, the spacers 132 comprise multiple layers of spacer material, which are formed at different times during the etching processes used to define the MTJs 119. More specifically, the spacers 132 include a first spacer layer 132A, formed after patterning the capping layer 118E, the maintenance layer 118D, the free layer 118C, and the tunnel barrier layer 118B, and a second spacer layer 132B (illustrated in FIGS. 16A and 16B), formed after at least partially patterning the reference layer 118A.

Figure 15A:
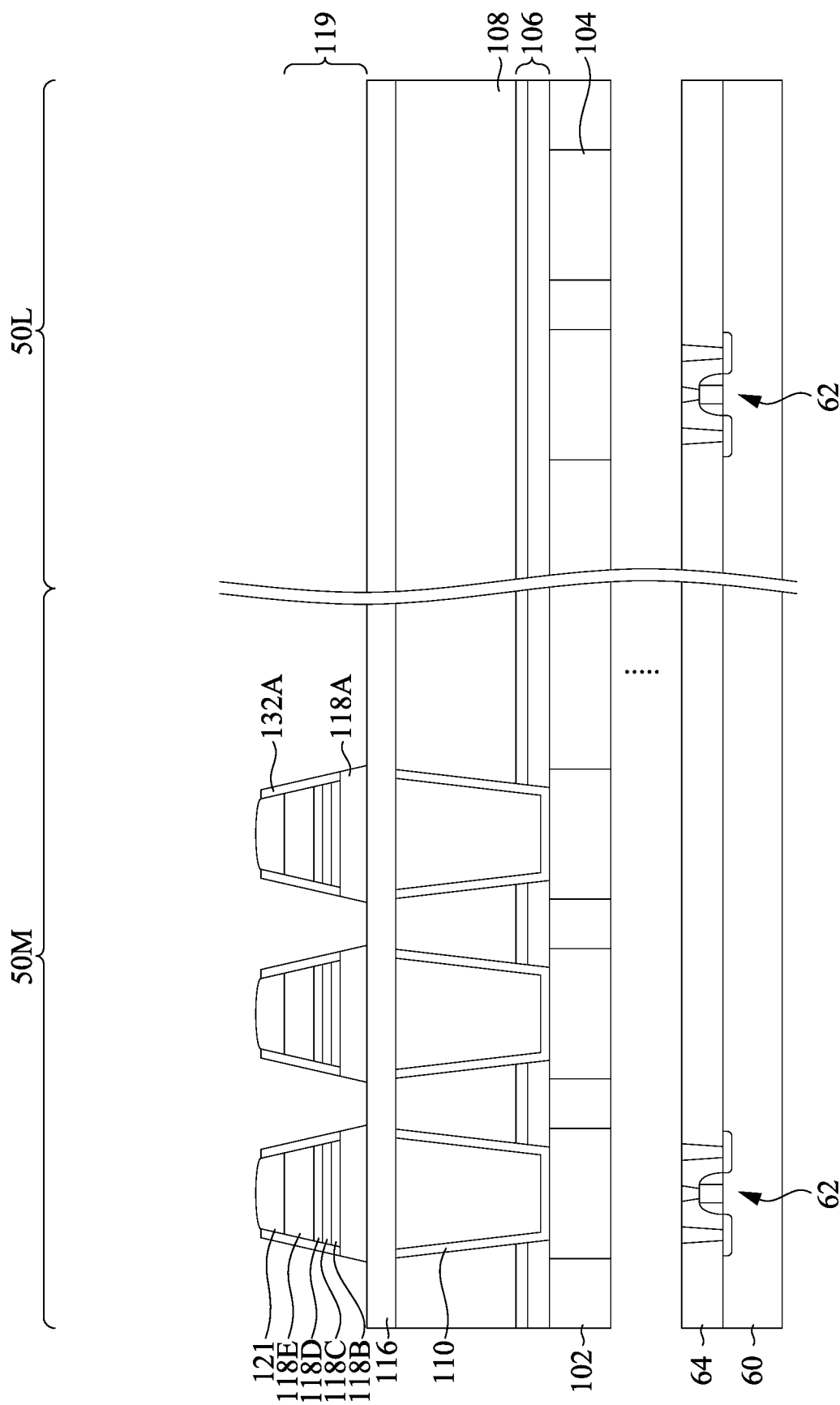
Figure 15B:
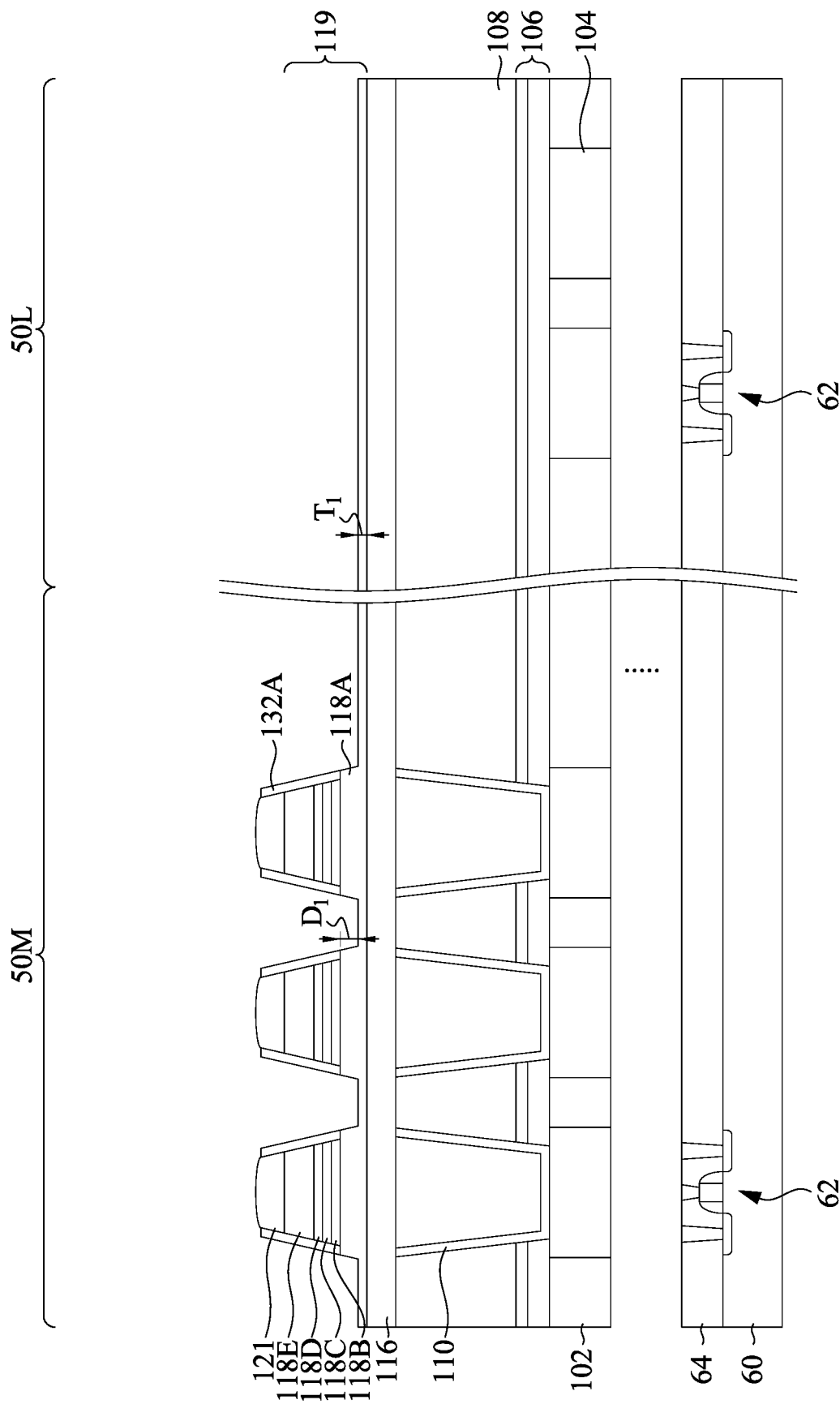

In FIGS. 15A and 15B, the first spacer layer 132A is formed and the reference layer 118A is etched. FIGS. 15A and 15B are similar to FIG. 11, except that after the first spacer layer 132A is formed, only the reference layer 118A is etched, rather than the reference layer 118A, the bottom electrode layer 116, and the IMD layer 108. The first spacer layer 132A may be formed of materials and by processes the same as or similar to those used to form the spacers 132, discussed above with respect to FIGS. 10 and 11. For example, the first spacer layer 132A may comprise a dielectric material, such as silicon oxide, silicon nitride, or the like, and may be deposited to a thickness ranging from about 100 Å to about 150 Å. The first spacer layer 132A may be deposited by a conformal deposition process, such as CVD, ALD, or the like. After the first spacer layer 132A is deposited, the first spacer layer 132A and the reference layer 118A may be patterned by a second main etching process the same as, or similar to the second main etching process, described above with respect to FIG. 11, except that the etching time is less than that described above with respect to FIG. 11. The second main etching process may be performed until horizontal portions of the first spacer layer 132A are removed, the reference layer 118A is etched through, and the bottom electrode layer 116 is exposed. In the embodiment illustrated in FIG. 15B, the second main etching process is performed until horizontal portions of the first spacer layer 132A are removed and the reference layer 118A is partially etched through (e.g., the reference layer 118A is etched to a depth $D_1$ ranging from about 10 Å to about 100 Å, such that a thickness Ti ranging from about 0 Å to about 90 Å remains un-etched). After the second main etching process is performed, the first spacer layer 132A may have side surfaces that are continuous with tapered side surfaces of the reference layer 118A. The second main etching process used to pattern the first spacer layer 132A and the reference layer 118A may be a low-angle IBE process. The second main etching process may be performed for a duration ranging from about 50 seconds to about 300 seconds.

Figure 16A:
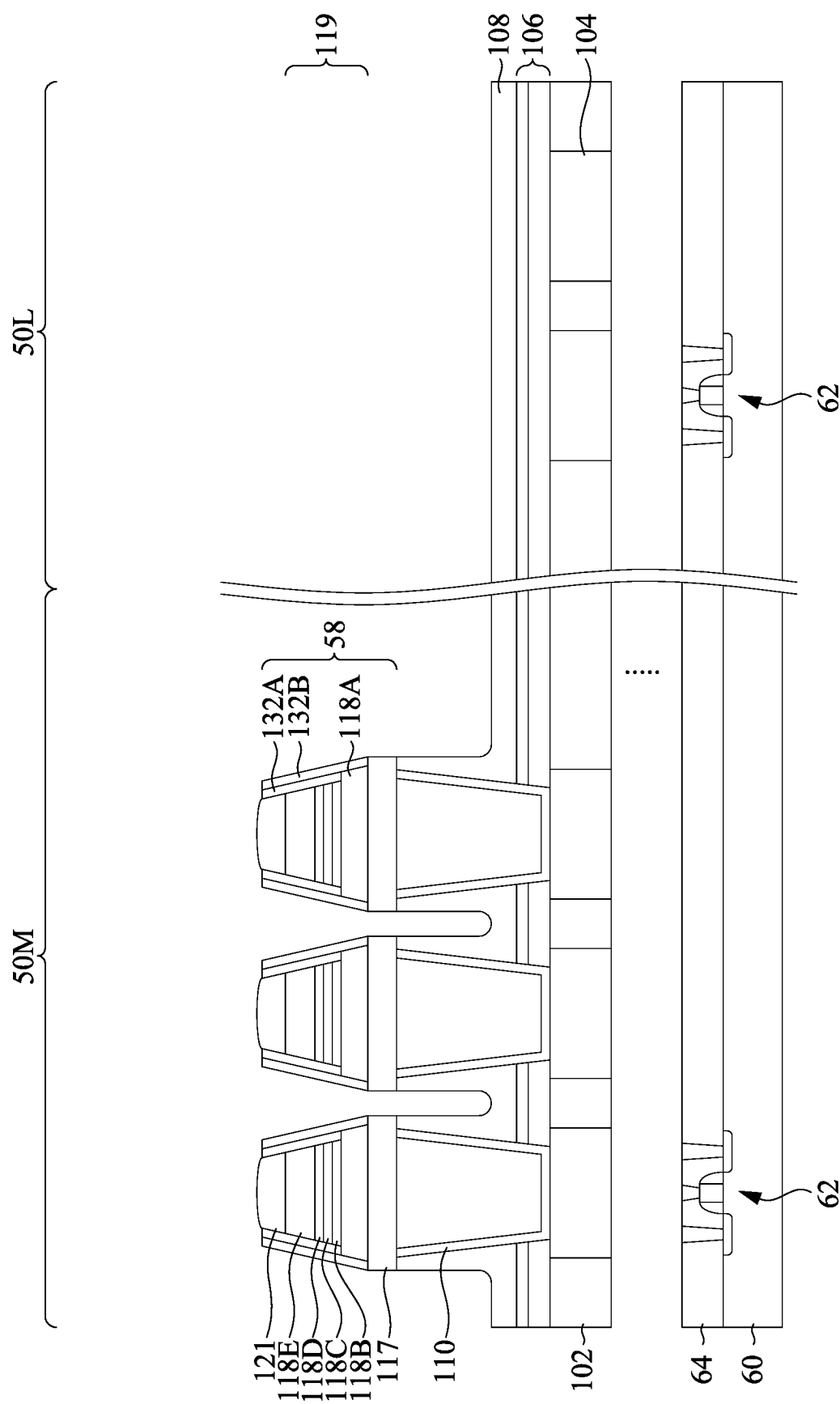
Figure 16B:
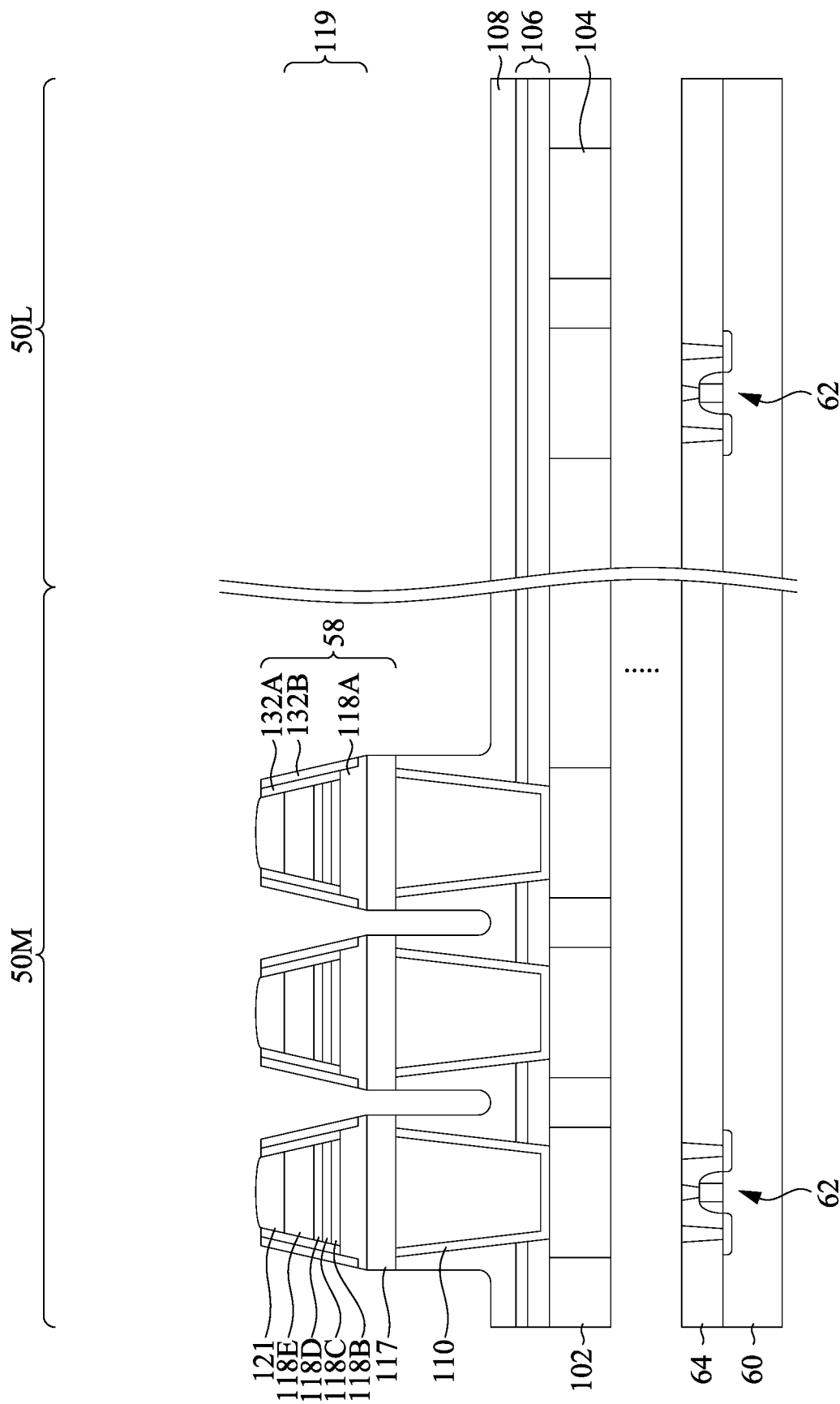

In FIGS. 16A and 16B, the second spacer layer 132B is formed and the bottom electrode layer 116 and the IMD layer 108 are etched. The second spacer layer 132B may be formed of materials and by processes the same as or similar to those used to form the spacers 132, discussed above with respect to FIGS. 10 and 11. For example, the second spacer layer 132B may comprise a dielectric material, such as silicon oxide, silicon nitride, or the like, and may be deposited to a thickness ranging from about 100 Å to about 150 Å. The second spacer layer 132B may be deposited by a conformal deposition process, such as CVD, ALD, or the like. In FIG. 16A, after the second spacer layer 132B is deposited, the second spacer layer 132B, the bottom electrode layer 116, and the IMD layer 108 may be patterned by a third main etching process the same as, or similar to the second main etching process, described above with respect to FIG. 11. The third main etching process may be performed to remove horizontal portions of the second spacer layer 132B, etch through the bottom electrode layer 116, forming bottom electrodes 117, and etch into the IMD layer 108. The third main etching process used to pattern the second spacer layer 132B, the bottom electrode layer 116, and the IMD layer 108 may be a low-angle IBE process. After the third main etching process is performed, the second spacer layer 132B may have side surfaces that are at an oblique angle and continuous with vertical side surfaces of the bottom electrodes 117. The MTJs 119 include a first tapered portion including the capping layer 118E, the maintenance layer 118D, the free layer 118C, and the tunnel barrier layer 118B, a step portion on a top surface of the reference layer 118A, and a second tapered portion including the reference layer 118A. The third main etching process may be performed for a duration ranging from about 50 seconds to about 300 seconds.

In the embodiment illustrated in FIG. 16B, the second spacer layer 132B is formed and the reference layer 118A, the bottom electrode layer 116, and the IMD layer 108 are etched. After the second spacer layer 132B is deposited, the second spacer layer 132B, the reference layer 118A, the bottom electrode layer 116, and the IMD layer 108 are patterned by the third main etching process. The third main etching process may be performed to remove horizontal portions of the second spacer layer 132B, remove horizontal portions of the reference layer 118A, etch through the bottom electrode layer 116, forming bottom electrodes 117, and etch into the IMD layer 108. After the third main etching process is performed, the second spacer layer 132B may have side surfaces that are at an oblique angle and continuous with vertical side surfaces of the bottom electrodes 117. The MTJs 119 include a first tapered portion including the capping layer 118E, the maintenance layer 118D, the free layer 118C, and the tunnel barrier layer 118B, a first step portion on a top surface of the reference layer 118A, a second tapered portion including the reference layer 118A, a second step portion on a horizontal surface of the reference layer 118A, and a third tapered portion including the reference layer 118A. The third main etching process may be performed for a duration ranging from about 50 seconds to about 300 seconds.

Providing the first spacer layer 132A along side surfaces of the capping layer 118E, the maintenance layer 118D, the free layer 118C, and the tunnel barrier layer 118B prevents damage to the capping layer 118E, the maintenance layer 118D, the free layer 118C, and the tunnel barrier layer 118B from the second main etching process. Further, providing the second spacer layer 132B along side surfaces of the reference layer 118A prevents damage to the reference layer 118A from the third main etching process. This improves the magnetic properties of the MTJs 119 (e.g., improves switching characteristics of the MTJs 119), prevents shorts from occurring between adjacent portions of the MTJs 119, reduces device defects, and improves device performance.

Figure 17:
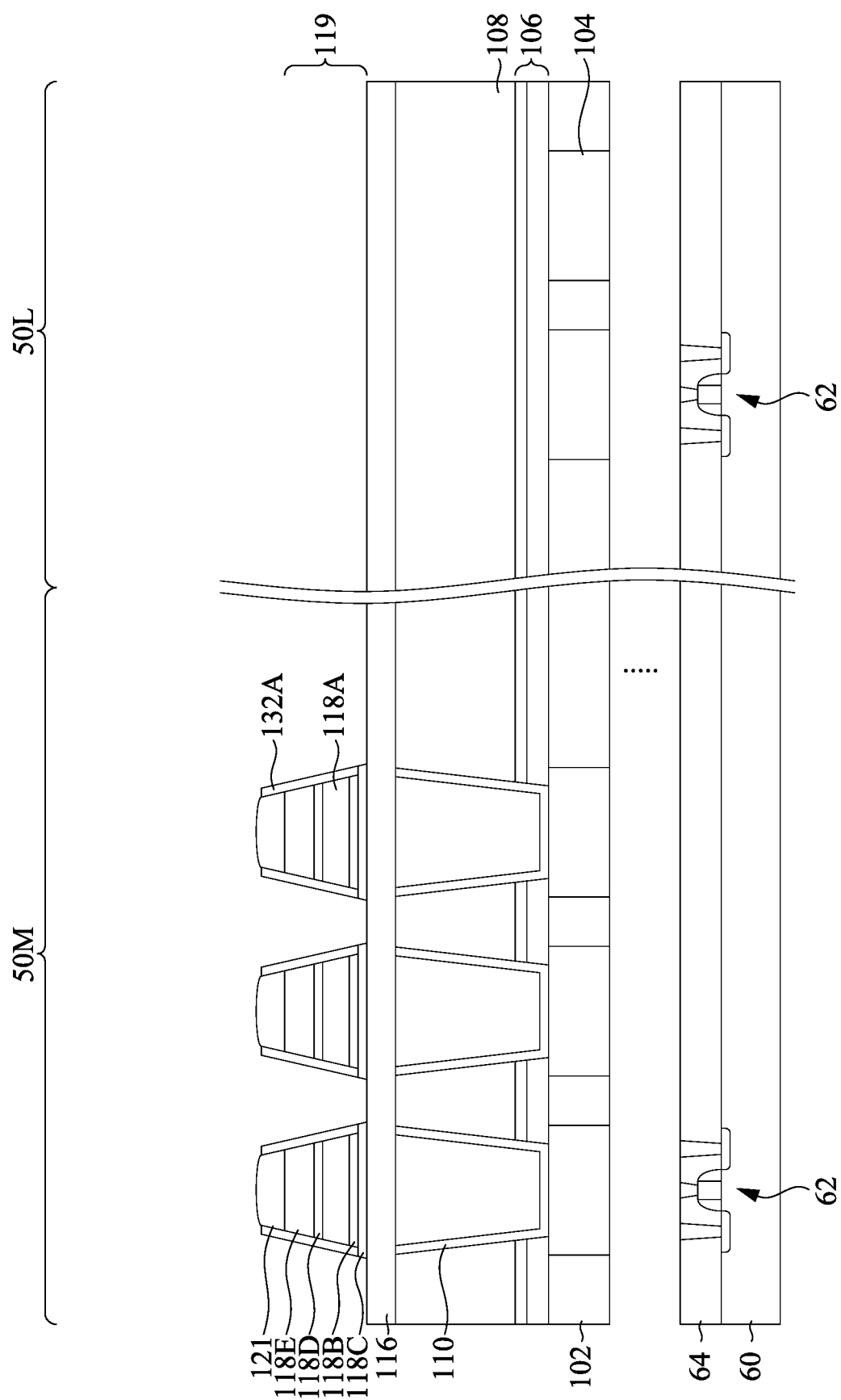
Figure 18:
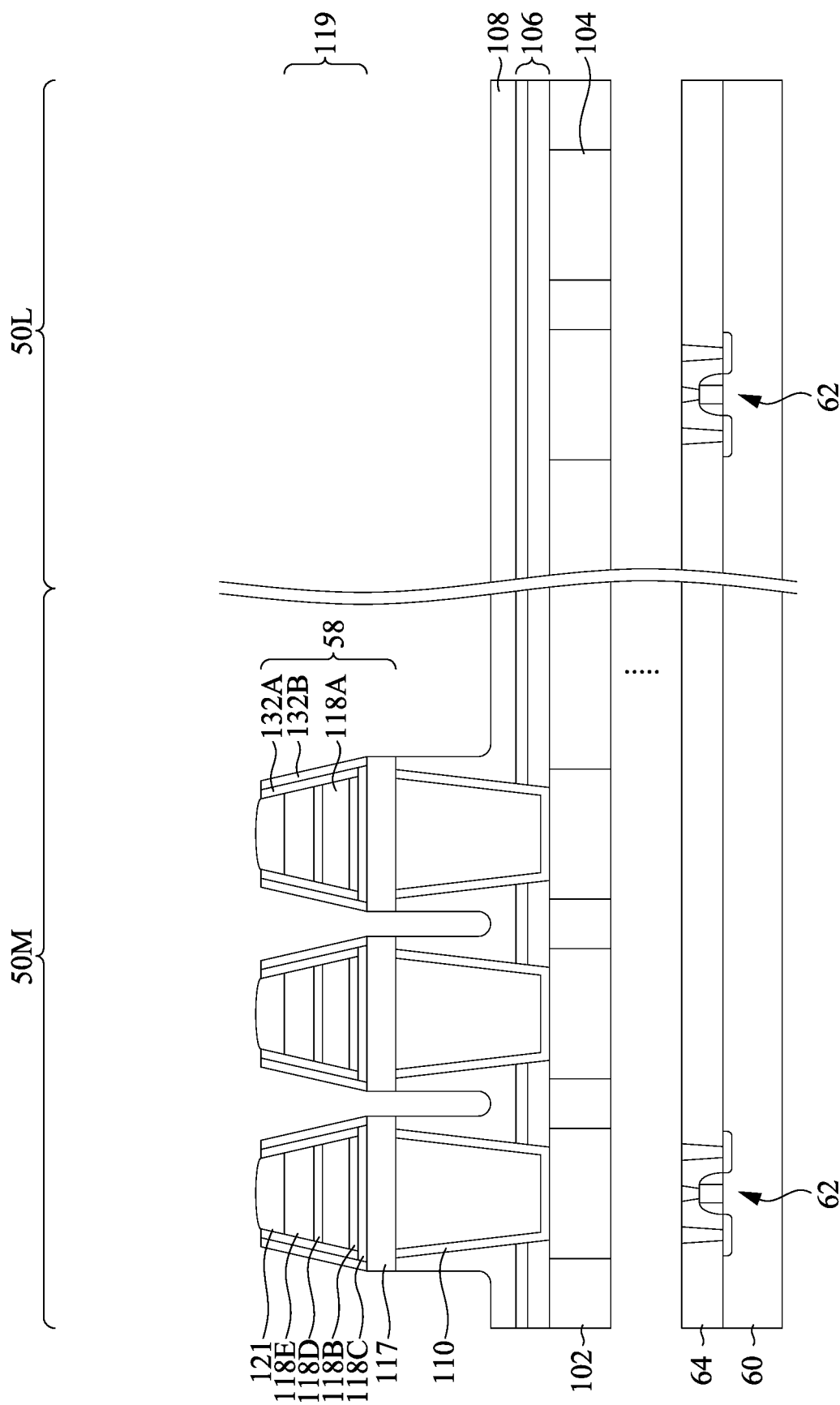

In FIGS. 17 and 18, the spacers 132 comprise multiple layers of spacer material, which are formed at different times during the etching processes used to define the MTJs 119, and the order of the reference layer 118A and the free layer 118C in the MTJ film stack 118 is reversed. The spacers 132 include a first spacer layer 132A, formed after patterning the capping layer 118E, the maintenance layer 118D, the reference layer 118A, and the tunnel barrier layer 118B, and a second spacer layer 132B (illustrated in FIG. 18), formed after patterning the free layer 118C.

In FIG. 17, the first spacer layer 132A is formed and the free layer 118C is etched. FIG. 17 is similar to FIG. 11, except that after the first spacer layer 132A is formed, only the free layer 118C is etched, rather than the free layer 118C, the bottom electrode layer 116, and the IMD layer 108. The first spacer layer 132A may be formed of materials and by processes the same as or similar to those used to form the spacers 132, discussed above with respect to FIGS. 10 and 11. For example, the first spacer layer 132A may comprise a dielectric material, such as silicon oxide, silicon nitride, or the like, and may be deposited to a thickness ranging from about 100 Å to about 150 Å. The first spacer layer 132A may be deposited by a conformal deposition process, such as CVD, ALD, or the like. After the first spacer layer 132A is deposited, the first spacer layer 132A and the free layer 118C may be patterned by a second main etching process the same as, or similar to the second main etching process, described above with respect to FIG. 11, except that the etching time is less than that described above with respect to FIG. 11. The second main etching process may be performed until horizontal portions of the first spacer layer 132A are removed, the free layer 118C is etched through, and the bottom electrode layer 116 is exposed. The second main etching process used to pattern the first spacer layer 132A and the free layer 118C may be a low-angle IBE process. After the second main etching process is performed, the first spacer layer 132A may have side surfaces that are continuous with tapered side surfaces of the free layer 118C. The second main etching process may be performed for a duration ranging from about 50 seconds to about 300 seconds.

In FIG. 18, the second spacer layer 132B is formed and the bottom electrode layer 116 and the IMD layer 108 are etched. The second spacer layer 132B may be formed of materials and by processes the same as or similar to those used to form the spacers 132, discussed above with respect to FIGS. 10 and 11. For example, the second spacer layer 132B may comprise a dielectric material, such as silicon oxide, silicon nitride, or the like, and may be deposited to a thickness ranging from about 100 Å to about 150 Å. The second spacer layer 132B may be deposited by a conformal deposition process, such as CVD, ALD, or the like. After the second spacer layer 132B is deposited, the second spacer layer 132B, the bottom electrode layer 116, and the IMD layer 108 may be patterned by a third main etching process the same as, or similar to the second main etching process, described above with respect to FIG. 11. The third main etching process may be performed to remove horizontal portions of the second spacer layer 132B, etch through the bottom electrode layer 116, forming bottom electrodes 117, and etch into the IMD layer 108. The third main etching process used to pattern the second spacer layer 132B, the bottom electrode layer 116, and the IMD layer 108 may be a low-angle IBE process. After the third main etching process is performed, the second spacer layer 132B may have side surfaces that are at an oblique angle and continuous with vertical side surfaces of the bottom electrodes 117. The MTJs 119 include a first tapered portion including the capping layer 118E, the maintenance layer 118D, the reference layer 118A, and the tunnel barrier layer 118B, a step portion on a top surface of the free layer 118C, and a second tapered portion including the free layer 118C. In some embodiments, the second spacer layer 132B may be formed along upper portions of the free layer 118C without being formed along lower portions of the free layer 118C, similar to the embodiment discussed above with respect to FIGS. 15B and 16B. In these embodiments, the MTJs 119 include a first tapered portion including the capping layer 118E, the maintenance layer 118D, the reference layer 118A, and the tunnel barrier layer 118B, a first step portion on a top surface of the free layer 118C, a second tapered portion including the free layer 118C, a second step portion on a horizontal surface of the free layer 118C, and a third tapered portion including the free layer 118C. The third main etching process may be performed for a duration ranging from about 50 seconds to about 300 seconds.

Providing the first spacer layer 132A along side surfaces of the capping layer 118E, the maintenance layer 118D, the reference layer 118A, and the tunnel barrier layer 118B prevents damage to the capping layer 118E, the maintenance layer 118D, the reference layer 118A, and the tunnel barrier layer 118B from the second main etching process. Further, providing the second spacer layer 132B along side surfaces of the free layer 118C prevents damage to the free layer 118C from the third main etching process. This improves the magnetic properties of the MTJs 119 (e.g., improves switching characteristics of the MTJs 119), prevents shorts from occurring between adjacent portions of the MTJs 119, reduces device defects, and improves device performance.

Embodiments may achieve advantages. For example, forming the spacers 132 along portions of the MTJ film stack 118 during the etching of the MTJ film stack 118 protects side surfaces of the MTJ film stack 118 from being damaged by the processes used to etch the MTJ film stack 118. This prevents damage to the magnetic properties of the MTJs 119 (e.g., prevents switching characteristics of the MTJs 119 from being deteriorated), and prevents shorts from occurring between the MRAM cells 58. This reduces device defects and improves device performance.

In accordance with an embodiment, a semiconductor device includes a first conductive feature on a semiconductor substrate; a bottom electrode on the first conductive feature; a magnetic tunnel junction (MTJ) stack on the bottom electrode, the MTJ stack including a reference layer on the bottom electrode; a tunnel barrier layer on the reference layer; and a free layer on the reference layer; a first spacer in contact with a side surface of the free layer and a side surface of the tunnel barrier layer, a bottom surface of the first spacer being level with a bottom surface of the tunnel barrier layer; and a top electrode on the MTJ stack. In an embodiment, the semiconductor device further includes a dielectric layer in contact with a side surface of the first spacer and a side surface of the reference layer. In an embodiment, the dielectric layer includes aluminum oxide. In an embodiment, the semiconductor device further includes a second spacer in contact with a side surface of the first spacer and a side surface of the reference layer. In an embodiment, the semiconductor device further includes a second spacer in contact with a side surface of the first spacer, a bottom surface of the second spacer being level with the bottom surface of the tunnel barrier layer. In an embodiment, the MTJ stack includes a step between the reference layer and the tunnel barrier layer.

In accordance with another embodiment, a semiconductor device including a first conductive feature on a semiconductor substrate; a bottom electrode on the first conductive feature; a magnetic tunnel junction (MTJ) on the bottom electrode; a first spacer on the MTJ, the first spacer being in contact with a side surface of the MTJ; a top electrode on the MTJ; and a first dielectric layer on the bottom electrode, the MTJ, the first spacer, and the top electrode, the first dielectric layer being in contact with side surfaces of the MTJ and the first spacer. In an embodiment, the MTJ includes a free layer, a tunnel barrier layer, and a reference layer, the first spacer is in contact with a side surface of the free layer and a side surface of the tunnel barrier layer, and the first dielectric layer is in contact with a side surface of the reference layer. In an embodiment, the MTJ includes a reference layer, a tunnel barrier layer, and a free layer, the first spacer is in contact with a side surface of the reference layer and a side surface of the tunnel barrier layer, and the first dielectric layer is in contact with a side surface of the free layer. In an embodiment, the first dielectric layer includes aluminum oxide. In an embodiment, the first spacer is in contact with a side surface of the top electrode, and a top surface of the first spacer is below a top surface of the top electrode. In an embodiment, the MTJ includes a stepped structure adjacent the first spacer. In an embodiment, the MTJ includes a reference layer, a tunnel barrier layer, and a free layer, the first spacer includes a first spacer layer and a second spacer layer, the first spacer layer is in contact with a side surface of the free layer and a side surface of the tunnel barrier layer, and the second spacer layer is in contact with a side surface of the reference layer. In an embodiment, the MTJ includes a first step adjacent the first spacer layer and a second step adjacent the second spacer layer.

In accordance with yet another embodiment, a method includes depositing a bottom electrode layer over a semiconductor substrate; depositing a magnetic tunnel junction (MTJ) film stack over the bottom electrode layer; depositing a top electrode layer over the MTJ film stack; patterning the top electrode layer; performing a first etch process to pattern the MTJ film stack; performing a first trim process on the MTJ film stack; after performing the first trim process, depositing a first spacer layer over the MTJ film stack; and after depositing the first spacer layer, performing a second etch process to pattern the first spacer layer, the MTJ film stack, and the bottom electrode layer to form a magnetoresistive random-access memory (MRAM) cell. In an embodiment, the top electrode layer is patterned by a reactive ion etching process, and the first etch process includes an ion beam etching process with an incidence angle of less than 30°. In an embodiment, the first trim process includes a first ion beam etching process with a first incidence angle of greater than 30° and a second ion beam etching process with a second incidence angle of less than 30°. In an embodiment, the first trim process is performed for less than 200 seconds. In an embodiment, the second etch process includes an ion beam etching process with an incidence angle of less than 30°. In an embodiment, the method further includes depositing a second spacer layer over the first spacer layer, the first spacer layer being deposited by atomic layer deposition, and the second spacer layer being deposited by chemical vapor deposition.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first conductive feature on a semiconductor substrate;
a bottom electrode on the first conductive feature;
a magnetic tunnel junction (MTJ) stack on the bottom electrode, the MTJ stack comprising:
a reference layer on the bottom electrode;
a tunnel barrier layer on the reference layer; and
a free layer on the reference layer;
a first spacer in contact with a side surface of the free layer and a side surface of the tunnel barrier layer, wherein a bottom surface of the first spacer is level with a bottom surface of the tunnel barrier layer;
a second spacer adjacent the first spacer and has a bottom surface nearer the semiconductor substrate than a bottom surface of the first spacer; and
a top electrode on the MTJ stack.

2. The semiconductor device of claim 1, further comprising a dielectric layer in contact with a side surface of the first spacer and a side surface of the reference layer.

3. The semiconductor device of claim 2, wherein the dielectric layer comprises aluminum oxide.

4. The semiconductor device of claim 1, wherein the MTJ stack comprises a step between the reference layer and the tunnel barrier layer.

5. The semiconductor device of claim 1, wherein a bottom surface of the second spacer is level with the bottom surface of the reference layer.

6. The semiconductor device of claim 1, wherein the second spacer is in contact with a side surface of the first spacer and a side surface of the reference layer.

7. A semiconductor device comprising:
a first conductive feature on a semiconductor substrate;
a bottom electrode on the first conductive feature;
a magnetic tunnel junction (MTJ) on the bottom electrode;
a first spacer on the MTJ, wherein the first spacer comprises a first spacer layer and a second spacer layer, wherein the first spacer layer is in contact with a side surface of the MTJ, wherein the second spacer layer is in contact with the bottom electrode;
a top electrode on the MTJ; and
a first dielectric layer on the bottom electrode, the MTJ, the first spacer, and the top electrode, wherein the first dielectric layer is in contact with side surfaces of the MTJ and the first spacer.

8. The semiconductor device of claim 7, wherein the MTJ comprises a free layer, a tunnel barrier layer, and a reference layer, wherein the first spacer is in contact with a side surface of the free layer and a side surface of the tunnel barrier layer, and wherein the first dielectric layer is in contact with a side surface of the reference layer.

9. The semiconductor device of claim 7, wherein the MTJ comprises a reference layer, a tunnel barrier layer, and a free layer, wherein the first spacer is in contact with a side surface of the reference layer and a side surface of the tunnel barrier layer, and wherein the first dielectric layer is in contact with a side surface of the free layer.

10. The semiconductor device of claim 7, wherein the first dielectric layer comprises aluminum oxide.

11. The semiconductor device of claim 7, wherein the first spacer is in contact with a side surface of the top electrode, and wherein a top surface of the first spacer is below a top surface of the top electrode.

12. The semiconductor device of claim 7, wherein the MTJ comprises a stepped structure adjacent the first spacer.

13. The semiconductor device of claim 7, wherein the MTJ comprises a reference layer, a tunnel barrier layer, and a free layer, wherein the first spacer layer is in contact with a side surface of the free layer and a side surface of the tunnel barrier layer, and wherein the second spacer layer is in contact with a side surface of the reference layer.

14. The semiconductor device of claim 13, wherein the MTJ comprises a first step adjacent the first spacer layer and a second step adjacent the second spacer layer.

15. A semiconductor device comprising:
a bottom electrode on a substrate;
a magnetic tunnel junction (MTJ) stack on the bottom electrode, the MTJ stack comprising a reference layer, a tunnel barrier layer, and a free layer;
a first spacer layer in contact with side surfaces of the free layer and the tunnel barrier layer;
a second spacer layer in contact with a side surface of the reference layer, wherein the second spacer layer is in contact with the bottom electrode; and
a top electrode on the MTJ stack;
wherein the MTJ stack comprises a stepped structure, with a first step adjacent the first spacer layer and a second step adjacent the second spacer layer.

16. The semiconductor device of claim 15, wherein a bottom surface of the first spacer layer is level with a bottom surface of the tunnel barrier layer.

17. The semiconductor device of claim 15, wherein the first spacer layer and the second spacer layer comprise different materials.

18. The semiconductor device of claim 15, further comprising a dielectric layer in contact with side surfaces of the second spacer layer and the reference layer.

19. The semiconductor device of claim 18, wherein the dielectric layer is in contact with the bottom electrode.

20. The semiconductor device of claim 15, wherein the first spacer layer and the second spacer layer form a multi-layer spacer structure adjacent to the MTJ stack.

\* \* \* \* \*